United States Patent
Yamaguchi et al.

(10) Patent No.: US 9,781,864 B2
(45) Date of Patent: Oct. 3, 2017

(54) COOLING APPARATUS AND COOLING METHOD

(71) Applicant: FUJITSU LIMITED, Kawasaki-shi, Kanagawa (JP)

(72) Inventors: Yoshitaka Yamaguchi, Oota (JP); Hideaki Maeda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 229 days.

(21) Appl. No.: 14/484,697

(22) Filed: Sep. 12, 2014

(65) Prior Publication Data
US 2015/0116930 A1  Apr. 30, 2015

(30) Foreign Application Priority Data
Oct. 31, 2013 (JP) ................... 2013-227448

(51) Int. Cl.
*H05K 7/20* (2006.01)
*G06F 1/20* (2006.01)

(52) U.S. Cl.
CPC ......... *H05K 7/20736* (2013.01); *G06F 1/206* (2013.01); *H05K 7/20209* (2013.01); *H05K 7/20836* (2013.01); *Y02B 60/1275* (2013.01)

(58) Field of Classification Search
CPC ........... H05K 7/20209; H05K 7/20736; H05K 7/20836; G06F 1/206; Y02B 60/1275; H05B 7/20709
See application file for complete search history.

(56) References Cited

U.S. PATENT DOCUMENTS

| 6,398,505 | B1 | 6/2002 | Sekiguchi | |
|---|---|---|---|---|
| 2002/0140389 | A1* | 10/2002 | Ohki | G06F 1/206 318/471 |
| 2003/0065426 | A1* | 4/2003 | Iino | H05K 7/20836 700/300 |
| 2003/0198018 | A1* | 10/2003 | Cipolla | G06F 9/52 361/679.48 |
| 2003/0218465 | A1* | 11/2003 | Rijken | H05K 7/20209 324/537 |
| 2005/0171648 | A1* | 8/2005 | Frankel | G05D 23/1917 700/300 |
| 2006/0037334 | A1* | 2/2006 | Tien | G06F 1/206 62/178 |
| 2006/0202647 | A1* | 9/2006 | Lin | H05K 7/20209 318/66 |

(Continued)

FOREIGN PATENT DOCUMENTS

| JP | 05-243768 | 9/1993 |
|---|---|---|
| JP | 2000-346512 | 12/2000 |

(Continued)

OTHER PUBLICATIONS

Japanese Office Action dated Jun. 6, 2017 in related Japanese Application No. 2013-227448.

*Primary Examiner* — Jennifer L Norton
(74) *Attorney, Agent, or Firm* — Staas & Halsey LLP

(57) ABSTRACT

A cooling apparatus that cools an electronic apparatus accommodated in a cabinet, the cooling apparatus includes: a plurality of cooling fans attached to the cabinet; and a control unit that controls a rotation speed of the cooling fans that have been grouped into a plurality of groups, for each of the groups, depending on a group temperature that typifies each of the groups to which the cooling fans belong.

10 Claims, 23 Drawing Sheets

(56) References Cited

U.S. PATENT DOCUMENTS

| | | | | |
|---|---|---|---|---|
| 2011/0176275 A1* | 7/2011 | Sato | ............... | G06F 1/206 361/695 |
| 2012/0078420 A1* | 3/2012 | Jensen | ............... | G05B 11/16 700/275 |
| 2013/0288588 A1* | 10/2013 | Shih | ............... | G06F 1/206 454/256 |
| 2014/0198451 A1* | 7/2014 | Kuo | ............... | G01K 1/026 361/695 |
| 2015/0002999 A1* | 1/2015 | Tang | ............... | G06F 1/20 361/679.31 |
| 2015/0032283 A1* | 1/2015 | Kelkar | ............... | H05K 7/20745 700/300 |

FOREIGN PATENT DOCUMENTS

| | | |
|---|---|---|
| JP | 2002-98088 | 4/2002 |
| JP | 2005-159281 | 6/2005 |
| JP | 2008-123200 | 5/2008 |
| JP | 2011-066366 | 3/2011 |
| WO | 2013/151117 A1 | 10/2013 |

* cited by examiner

|  | A0 | A1 | A2 | A3 | A4 | A5 |
|---|---|---|---|---|---|---|
| FAN01 | 0 | 0 | 0 | 0 | 0 | 1 |
| FAN02 | 0 | 0 | 0 | 0 | 1 | 0 |
| ⋮ | ⋮ | ⋮ | ⋮ | ⋮ | ⋮ | ⋮ |
| ⋮ | ⋮ | ⋮ | ⋮ | ⋮ | ⋮ | ⋮ |

FIG. 16

GROUP INFORMATION TABLE TB

| CONTROL GROUP NUMBER | ADJACENT GROUP SETTING NUMBER | COOLING FAN INFORMATION | | | | | |
|---|---|---|---|---|---|---|---|
| | | | FAN04 | FAN05 | FAN06 | FAN** | |
| G1 | null | FAN NUMBER | ta | tb | tc | FAN** | |
| | | FIRST REFERENCE TEMPERATURE | td | te | tf | *** | |
| | | SECOND REFERENCE TEMPERATURE | xyz | zzz | abc | *** | |
| | | REFERENCE NUMBER OF REVOLUTIONS | FAN** | FAN** | FAN** | FAN** | |
| | | FAN NUMBER | *** | *** | *** | *** | |
| | | FIRST REFERENCE TEMPERATURE | *** | *** | *** | *** | |
| | | SECOND REFERENCE TEMPERATURE | *** | *** | *** | *** | |
| | | REFERENCE NUMBER OF REVOLUTIONS | | | | | |

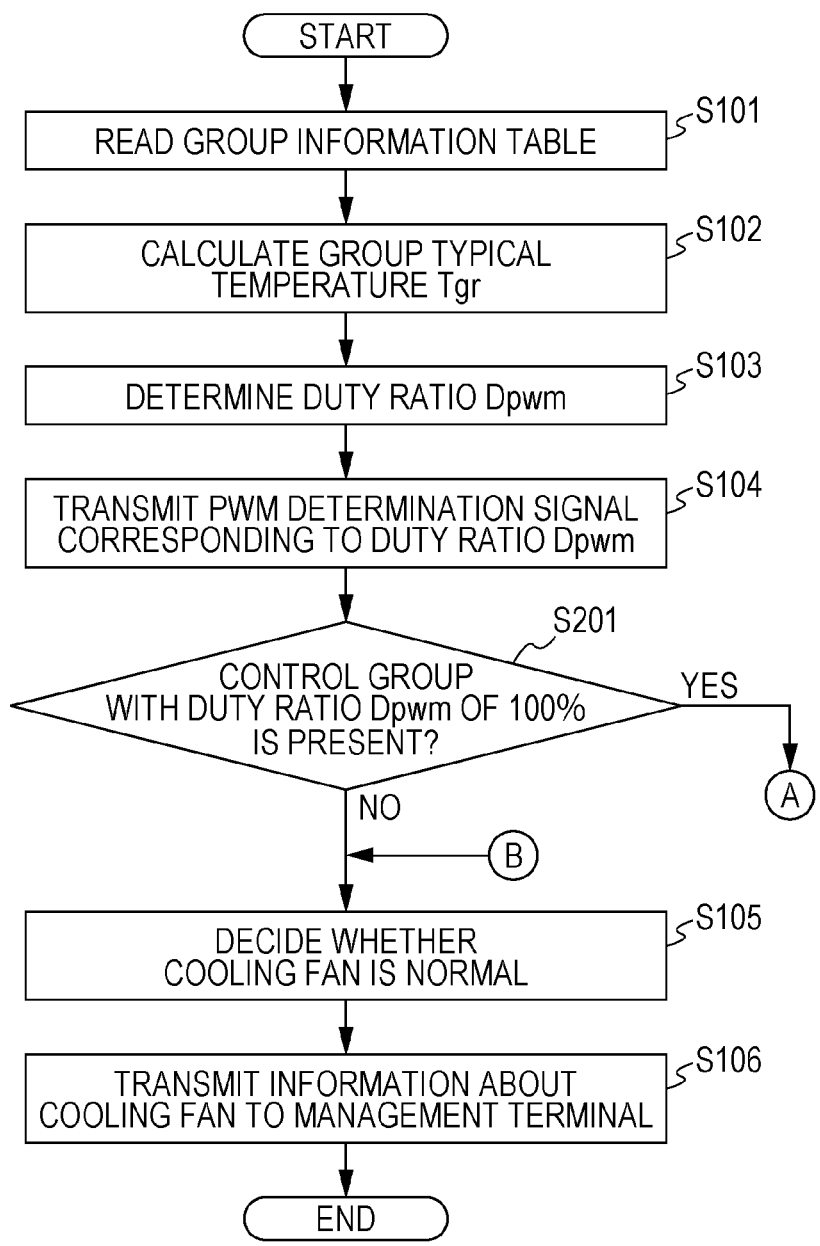

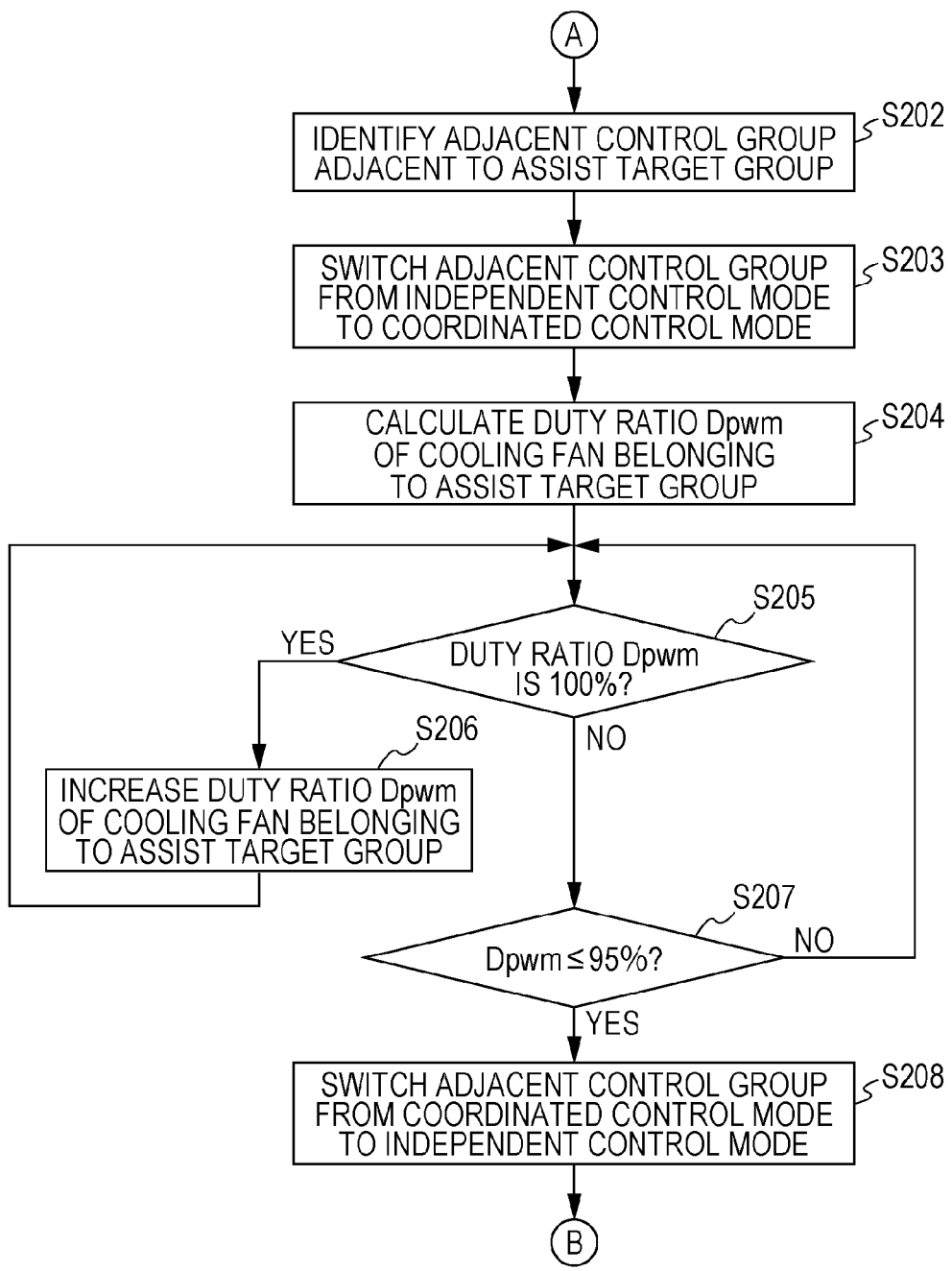

COOLING APPARATUS AND COOLING METHOD

CROSS-REFERENCE TO RELATED APPLICATION

This application is based upon and claims the benefit of priority of the prior Japanese Patent Application No. 2013-227448, filed on Oct. 31, 2013, the entire contents of which are incorporated herein by reference.

FIELD

The embodiments discussed herein are related to a cooling apparatus and cooling method that cool electronic apparatuses.

BACKGROUND

In a cabinet (rack) in which electronic apparatuses such as server apparatuses are accommodated (installed), cooling fans are often provided to cool the electronic apparatuses by exhausting heat generated by the electronic apparatuses externally from the inside of the rack. FIG. 1 depicts a server rack 100 of related art. In the example depicted in FIG. 1, a plurality of cooling fans 102 are arranged in the height direction of a back door 101 of a server rack 100. The server rack 100 depicted in FIG. 1 uses a front intake/back exhaust system that takes in air from the front of the rack and exhausts the air from the back by rotating the cooling fans 102. Other than this system, there are a front intake/top exhaust system that takes in air from the front of the rack and exhausts the air from the top of the rack, a bottom intake/top exhaust system that takes in air from the bottom of the rack and exhausts the air from the top of the rack, and so on.

Recently, suppression of the power consumption of cooling fans is increasingly requested. In response to such a situation, a cooling technique has been proposed in which a plurality of cooling fan units are detachable and the number of revolutions of cooling fans is controlled depending on the number of cooling fan units that operate normally.

Japanese Laid-open Patent Publication No. 2005-159281, Japanese Laid-open Patent Publication No. 5-243768, Japanese Laid-open Patent Publication No. 2008-123200, and Japanese Laid-open Patent Publication No. 2011-66366 are examples of related art.

If the ratio of accommodation (installation) of electronic apparatuses in a cabinet is low, the cooling fans corresponding to the portion (vacant space) in which no electronic apparatuses are accommodated may not be necessarily operated.

In addition, the state of installation of electronic apparatuses in the cabinet may be changed when, for example, the user adds an electronic apparatus. The amount of heat generation of electronic apparatuses accommodated in the cabinet is not fixed and may vary depending on the type and operational status of the electronic apparatuses.

SUMMARY

According to an aspect of the invention, a cooling apparatus that cools an electronic apparatus accommodated in a cabinet, the cooling apparatus includes: a plurality of cooling fans attached to the cabinet; and a control unit that controls a rotation speed of the cooling fans that have been grouped into a plurality of groups, for each of the groups, depending on a group temperature that typifies each of the groups to which the cooling fans belong.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 16 is a data structure diagram depicting an example of a group information table;

FIG. 24 is a flowchart depicting an example of processing performed by a processor of the control device; and FIG. 25 is a flowchart depicting an example of processing performed by the processor of the control device.

DESCRIPTION OF EMBODIMENTS

Embodiments of the present disclosure will be described with reference to the drawings.

Embodiment 1

Figure 2:
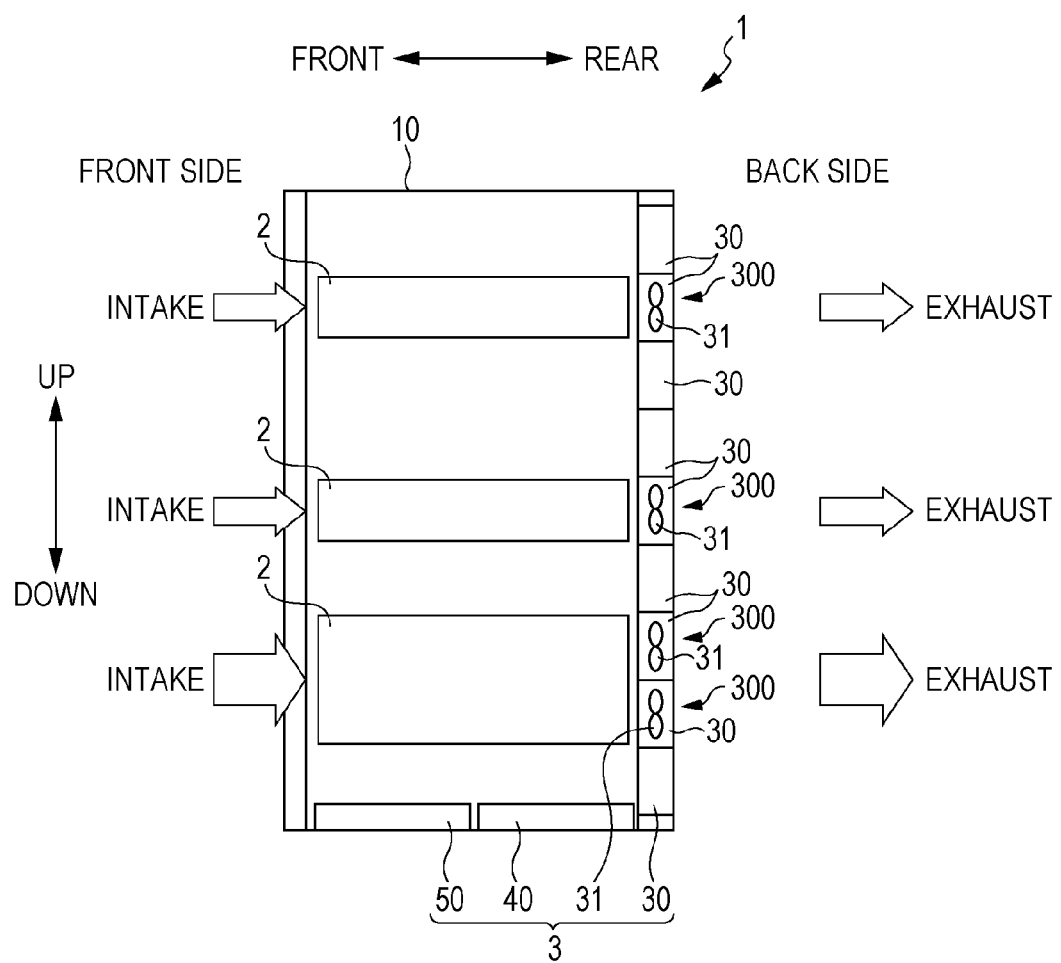
FIG. 2 depicts an example of the structure of a server according to embodiment 1.

FIG. 2 depicts an example of the structure of a server 1 according to embodiment 1. The server 1 includes a rack 10, a plurality of electronic apparatuses 2 accommodated (installed) in the rack 10, a cooling apparatus 3 that cools the electronic apparatuses 2, and so on. The electronic apparatus 2 is a server apparatus or a storage device, for example. The rack 10 is an example of the cabinet. The server 1 is a so-called a rack mount server (rack server), which stores a plurality of electronic apparatuses 2 arranged in the height (up-down) direction of the rack 10.

The cooling apparatus 3 mainly includes fan sockets 30, cooling fans 31, connector boxes 40, control device 50, and so on, which will be described below. A plurality of the fan sockets 30, to which the cooling fans 31 are attached detachably, are disposed in a grid pattern on the back (rear side) of the rack 10. In embodiment 1, ventilation is enabled on the front side the rack 10. On the back of the rack 10, as described later, the opening/closing lid included in the fan socket 30 is closed when the cooling fan 31 is not attached to the fan socket 30. When the cooling fan 31 is attached to the fan socket 30, the above opening/closing lid is opened. The fan socket 30 is an example of a holding unit.

When driven to rotate, the cooling fans 31 exhaust the air taken internally from the front side of the rack 10 from the back of the rack 10, thereby generating a cooled air flow passing through the electronic apparatuses 2 from the front side to the back side of the rack 10. In FIG. 2, the orientation of air taken internally from the front side of the rack 10 and the orientation of air evacuated externally from the back side of the rack 10 are indicated conceptually by outline arrows.

Figure 3:
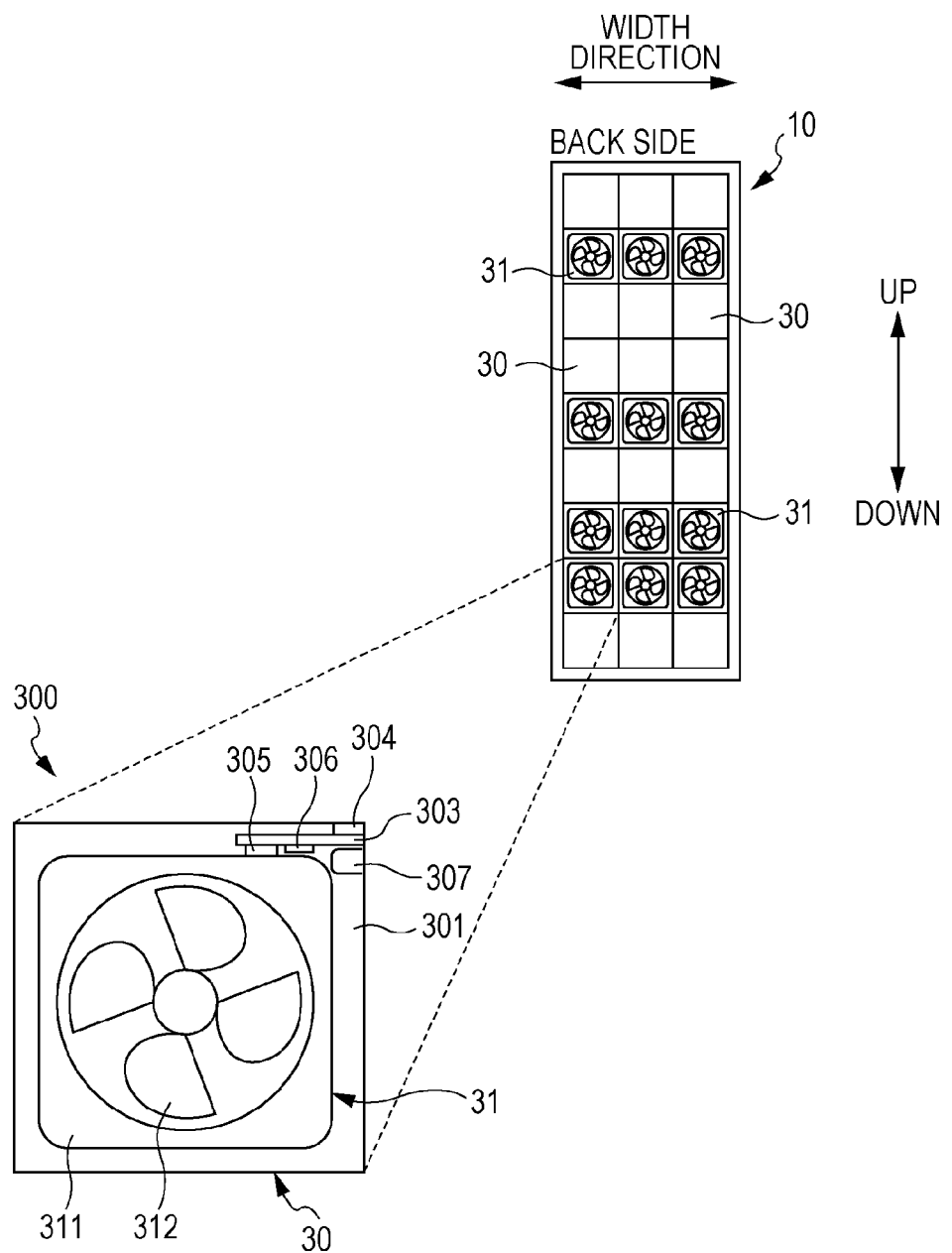
FIG. 3 depicts the back side of a rack according to embodiment 1.

FIG. 3 depicts the back side of the rack 10 according to embodiment 1. A plurality of the fan sockets 30 are arranged in a grid pattern on the back of the rack 10. In the example depicted in FIG. 3, a total of 27 fan sockets 30 (three in the width direction of the rack and nine in the up-down (height) direction) are arranged in a grid pattern. However, the number of the fan sockets 30 placed on the back of the rack 10 is not particularly limited. FIG. 3 also depicts an enlarged view in which one of the fan sockets 30 is enlarged. One cooling fan 31 may be attached to each of the fan sockets 30.

Figure 4:
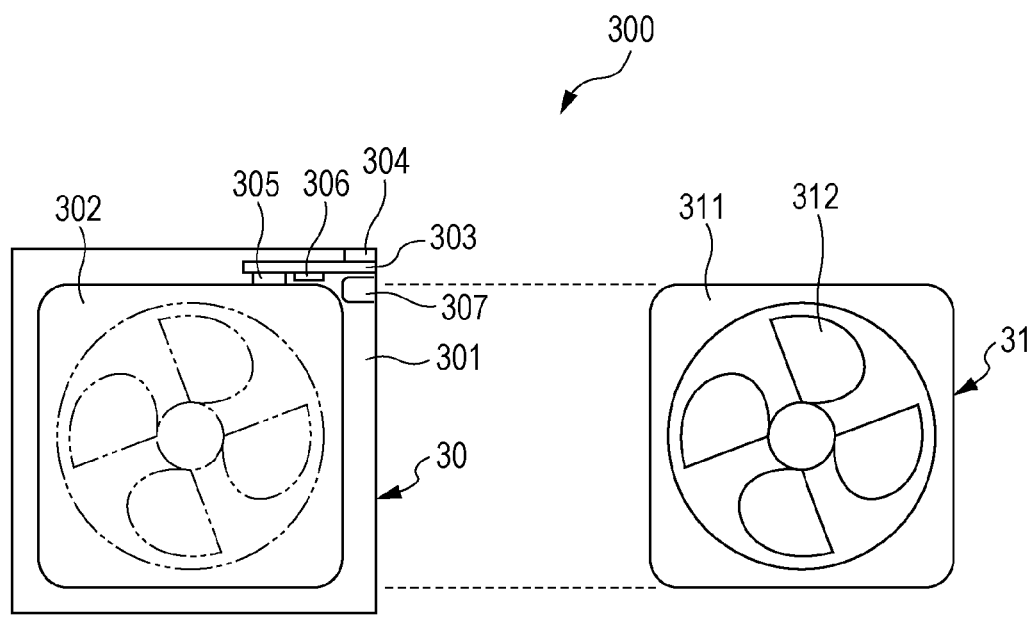
FIG. 4 depicts the relationship between a fan socket and a cooling fan according to embodiment 1.

FIG. 4 depicts the relationship between the fan socket 30 and the cooling fan 31 according to embodiment 1. In FIG. 4, the fan socket 30 is depicted on the left side and the cooling fan 31 is depicted on the right side. The fan socket 30 has a frame-shaped frame 301 and, inside the frame 301, an insertion hole 302 into which the cooling fan 31 is inserted is formed. In addition, a printed circuit board 303 is disposed on the frame 301 of the fan socket 30. A first connector 304 is installed on one surface of the printed circuit board 303 and a second connector 305 is installed on the other surface. In addition, a temperature sensor 306 is attached to the printed circuit board 303. The cooling fan 31 includes a frame 311 with a size and shape substantially the same as those of the insertion hole 302 of the fan socket 30, and blades 312. In the following, the fan socket 30, the cooling fan 31 attached to the fan socket 30, and the printed circuit board 303 disposed on the fan socket 30 are collectively referred to as a fan unit 300.

Figure 5:
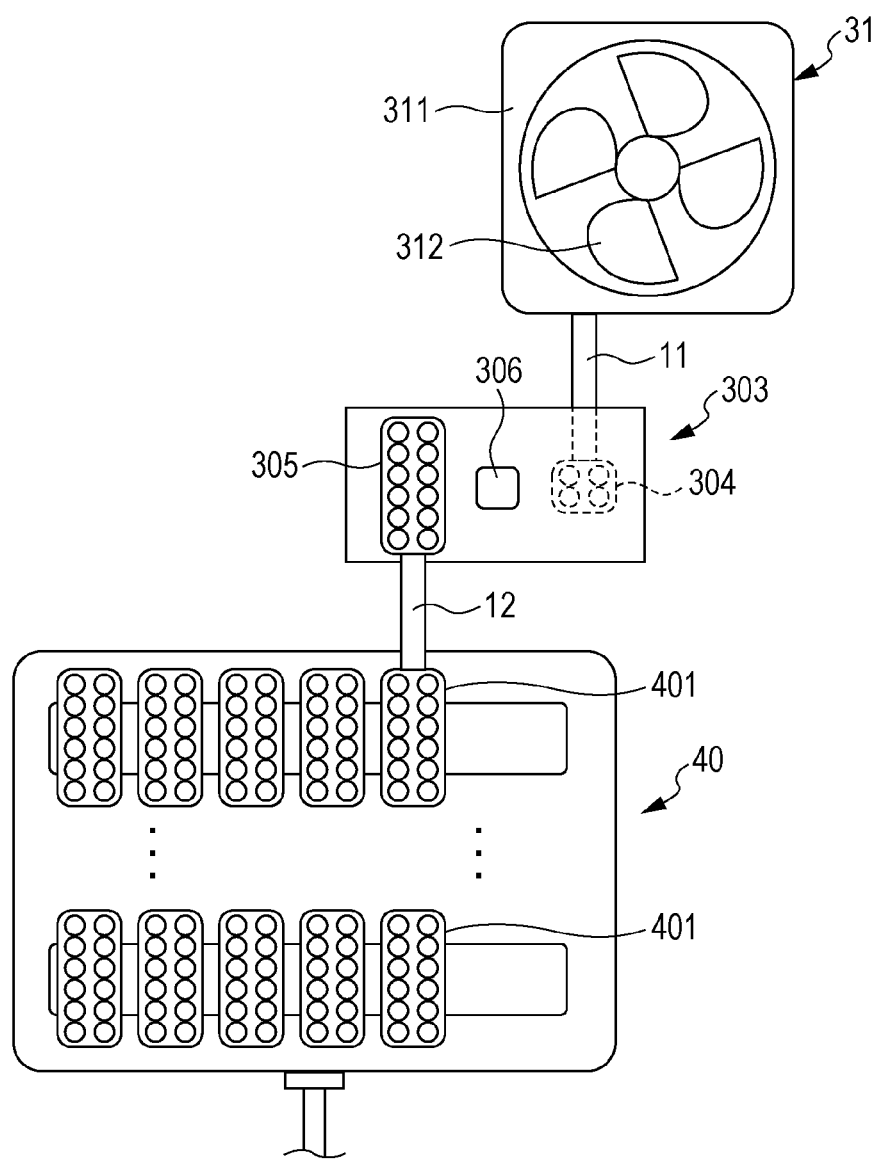
FIG. 5 depicts the connections of the cooling fan, a printed circuit board, and a connector box according to embodiment 1.
Figure 6:
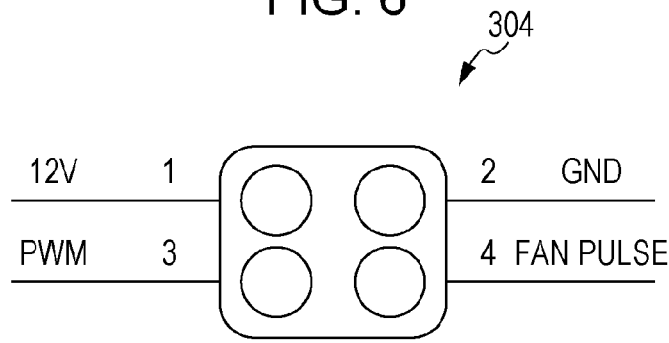
FIG. 6 depicts an example of the pin assignment of a first connector.

FIG. 5 depicts the connections of the cooling fan 31, the printed circuit board 303, and the connector box 40 according to embodiment 1. The connector box 40 is placed on the bottom (in the lower section) of the rack 10 as depicted in FIG. 2. The first connector 304 disposed on the printed circuit board 303 is connected via a connector to a wiring cable 11 of the cooling fan 31 as depicted in FIG. 5. FIG. 6 depicts an example of the pin assignment of the first connector 304. In the first connector 304, 12V is assigned to pin number 1, GND is assigned to pin number 2, the PWM signal is assigned to pin number 3, and the FAN PULSE signal is assigned to pin number 4. 12V assigned to pin number 1 is a driving voltage for driving the cooling fans 31. The PWM signal assigned to pin number 3 is a pulse signal transmitted from the control device 50 when the control device 50 controls the number of revolutions (rotation speed) of the cooling fans 31 using pulse width modulation (PWM). In PWM control, on/off control of the motor (not depicted) of the cooling fans 31 is performed using a pulse signal and the number of revolutions of the cooling fans 31 is controlled by changing the duty cycle of the pulse width depending on the level (DC level) of an input signal. The FAN PULSE signal assigned to pin number 4, which is a pulse signal generated by the cooling fan 31, decides the rotation status of the cooling fan 31. The control device 50 decides the current status (such as normal or abnormal) of the cooling fan 31 based on the FAN PULSE signal.

Figure 7:
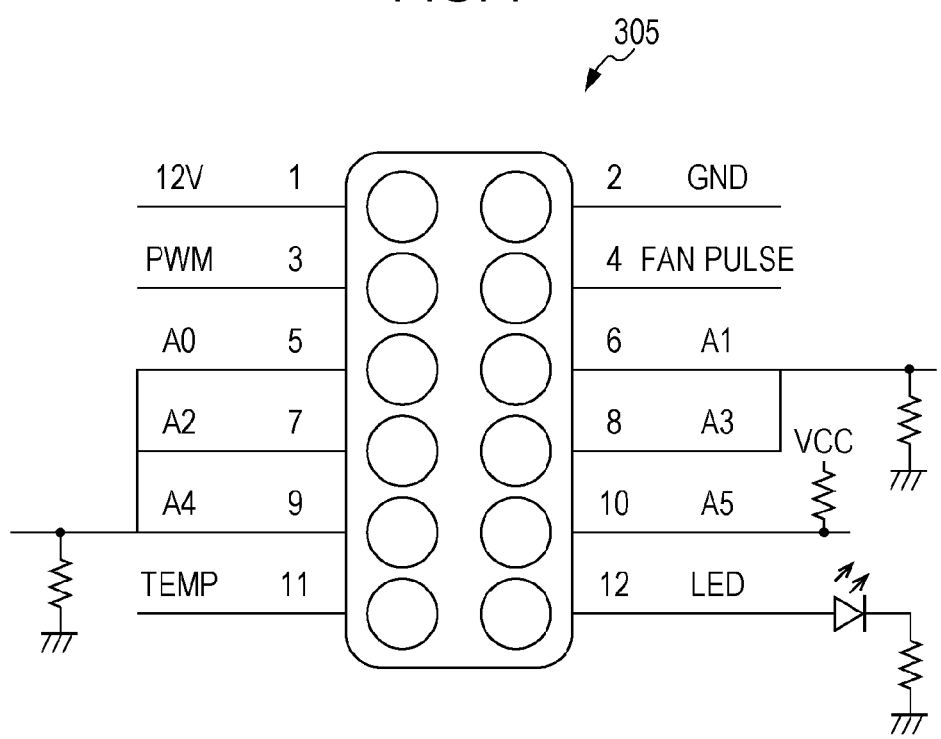
FIG. 7 depicts an example of the pin assignment of a second connector.

As depicted in FIG. 5, the second connector 305 disposed on the printed circuit board 303 is connected to a connector 401 disposed on the connector box 40 via a wiring cable with connector 308. FIG. 7 depicts an example of the pin assignment of the second connector 305. In the second connector 305, 12V is assigned to pin number 1, GND is assigned to pin number 2, the PWM signal is assigned to pin number 3, and the FAN PULSE signal is assigned to pin number 4. The address signals A0 to A5 are assigned to pin numbers 5 to 10, respectively. The positional information of the cooling fan 31 attached to the fan socket 30 is detected by the combination of the address signals A0 to A5. VCC in FIG. 7 represents a DC power source (voltage collector) for outputting the address signals A0 to A5.

Figures 8, 9:
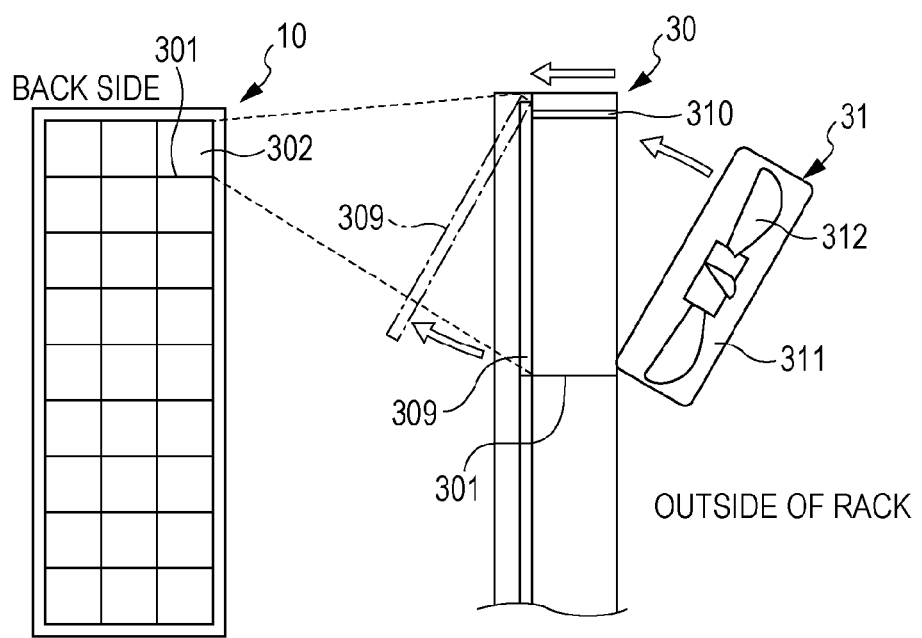
FIG. 8 depicts an example of addresses assigned to the cooling fans.
FIG. 9 depicts the structure of a cooling fan socket to which the cooling fan is attached detachably.

Since the 27 fan sockets 30 are disposed on the back of the rack 10 depicted in FIG. 3, a maximum of the 27 cooling fans 31 may be disposed in the rack 10. The above 27 cooling fans 31 are represented by FAN01 to FAN27, respectively. FIG. 8 depicts an example of the addresses assigned to the cooling fans 31 (FAN01 to FAN27). The numbers "0" and "1" depicted in FIG. 8 represent the voltage statuses of the address signals A0 to A5 in binary in the second connectors 305 of the printed circuit boards 303 disposed on the fan units 300 corresponding to FAN01 to FAN27. The arrangement of "0" and "1" representing the voltage statuses of the address signals A0 to A5 is uniquely assigned to each of the fan units 300 (the cooling fans 31) and the arrangement indicates the address of each of the cooling fans 31.

In addition, the TEMP signal is assigned to pin number 11 of the second connector 305 and the LED signal is assigned to pin number 12. The TEMP signal assigned to pin number 11 corresponds to temperature information (referred to below as individual temperatures) detected by the temperature sensor 306 mounted on the printed circuit board 303. The temperature sensor 306 detects the ambient temperature of the corresponding fan unit 300 (the cooling fans 31). On the other hand, the LED signal assigned to pin number 12 controls the display status of an LED display lamp 307 disposed on the fan socket 30.

Figure 10:
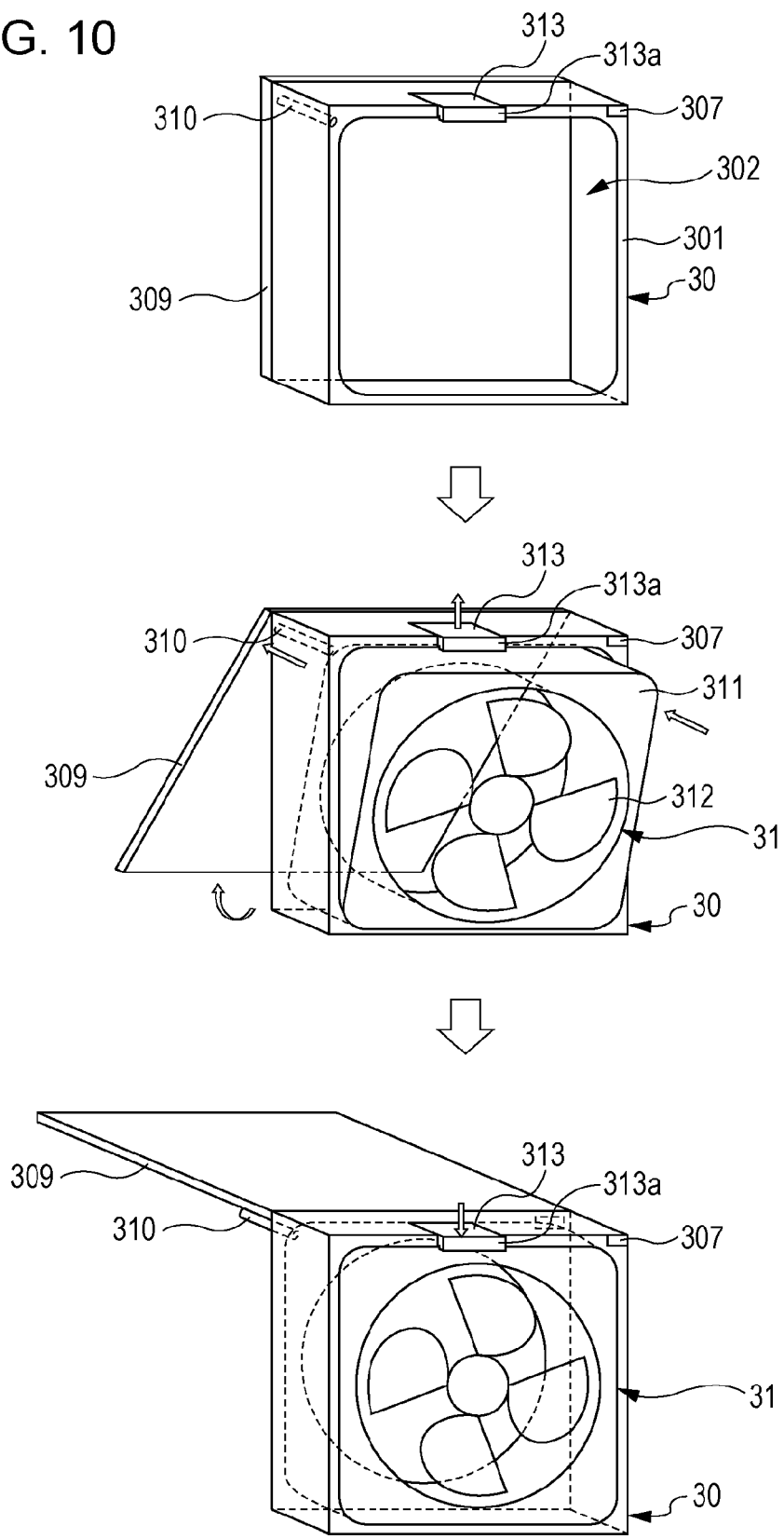
FIG. 10 depicts the structure of the cooling fan socket to which the cooling fan is attached detachably.

FIGS. 9 and 10 depict the structure of the fan socket 30 to which the cooling fan 31 is attached detachably. FIG. 9 is a side view depicting the state in which the cooling fan 31 is attached to any one of the fan sockets 30. FIG. 10 depicts the appearance of the fan socket 30 when the cooling fan 31 is attached to the fan socket 30. The upper part of FIG. 10 depicts the state before the cooling fan 31 is attached to the fan socket 30. The lower part of FIG. 10 depicts the state in which the cooling fan 31 has been attached to the fan socket 30. The middle part of FIG. 10 depicts the state in which the cooling fan 31 is being attached to the fan socket 30.

The fan socket 30 has an opening/closing lid 309 that exposes or covers the insertion hole 302 freely. The opening/closing lid 309 is a plate-like lid member of a substantially square shape with a size substantially the same as that of the frame 301 of the fan socket 30. In the frame 301, an upper edge of the opening/closing lid 309 is fixed, via a hinge, to the upper edge of a surface (facing the front side) of the frame 301 that faces the inside of the rack 10 (see FIG. 9). As depicted in the upper part of FIG. 10, in a state in which the cooling fan 31 is not attached to the fan socket 30, the opening/closing lid 309 is closed. That is, when the cooling fan 31 is not attached to the fan socket 30, the opening/closing lid 309 covers the insertion hole 302.

The fan socket 30 has an operating member 310 for opening or closing the opening/closing lid 309. The operating member 310 interferes with the frame 311 when the cooling fan 31 is inserted into the insertion hole 302, and the frame 311 pushes the operating member 310 toward the opening/closing lid 309. Consequently, as depicted in the middle part of FIG. 10, as the cooling fan 31 is inserted into the insertion hole 302, the frame 311 of the cooling fan 31 pushes and slides the operating member 310 toward the opening/closing lid 309. As described above, sliding of the operating member 310 gradually pushes the opening/closing lid 309 upward, thereby opening the opening/closing lid 309.

A locking member 313 is disposed at the top of the frame 301 of the fan socket 30. The locking member 313 has a substantially L-shaped cross section. An edge of the locking member 313 is connected to the frame 301 via a hinge so that locking member 313 freely swings, and a hook 313a is formed at the tip of the locking member 313. As depicted in the middle part of FIG. 10, as the cooling fan 31 is inserted into the insertion hole 302 of the fan socket 30, the upper surface of the frame 311 of the cooling fan 31 interferes with the locking member 313. As a result, the locking member 313 swings about the hinge shaft and is pushed upward. When the cooling fan 31 has been inserted into the insertion hole 302, the locking member 313 lowers and the hook 313a is caught in the frame 311 of the cooling fan 31 (see the lower part of FIG. 10). Consequently, the front surface of the frame 311 of the cooling fan 31 is locked by the hook 313a, keeping the cooling fan 31 from dropping accidentally from the fan socket 30.

When the cooling fan 31 is removed from the fan socket 30, the hook 313a of the locking member 313 is raised to release the lock, for example. Accordingly, the cooling fan 31 may be removed easily from the fan socket 30. As described above, the fan socket 30 according to the embodiment 1 allows the cooling fan 31 to be attached detachably. In addition, attachment of the cooling fan 31 to the fan socket 30 automatically opens the closed opening/closing lid 309. When the cooling fan 31 is removed from the fan socket 30, the operating member 310 that has been pushed by the frame 311 may be biased in a direction away from the opening/closing lid 309 by a biasing force applied by an elastic member (not depicted) such as a spring, for example. This enables the opening/closing lid 309 to be closed automatically in sync with removal of the cooling fan 31 from the fan socket 30.

Figure 11:
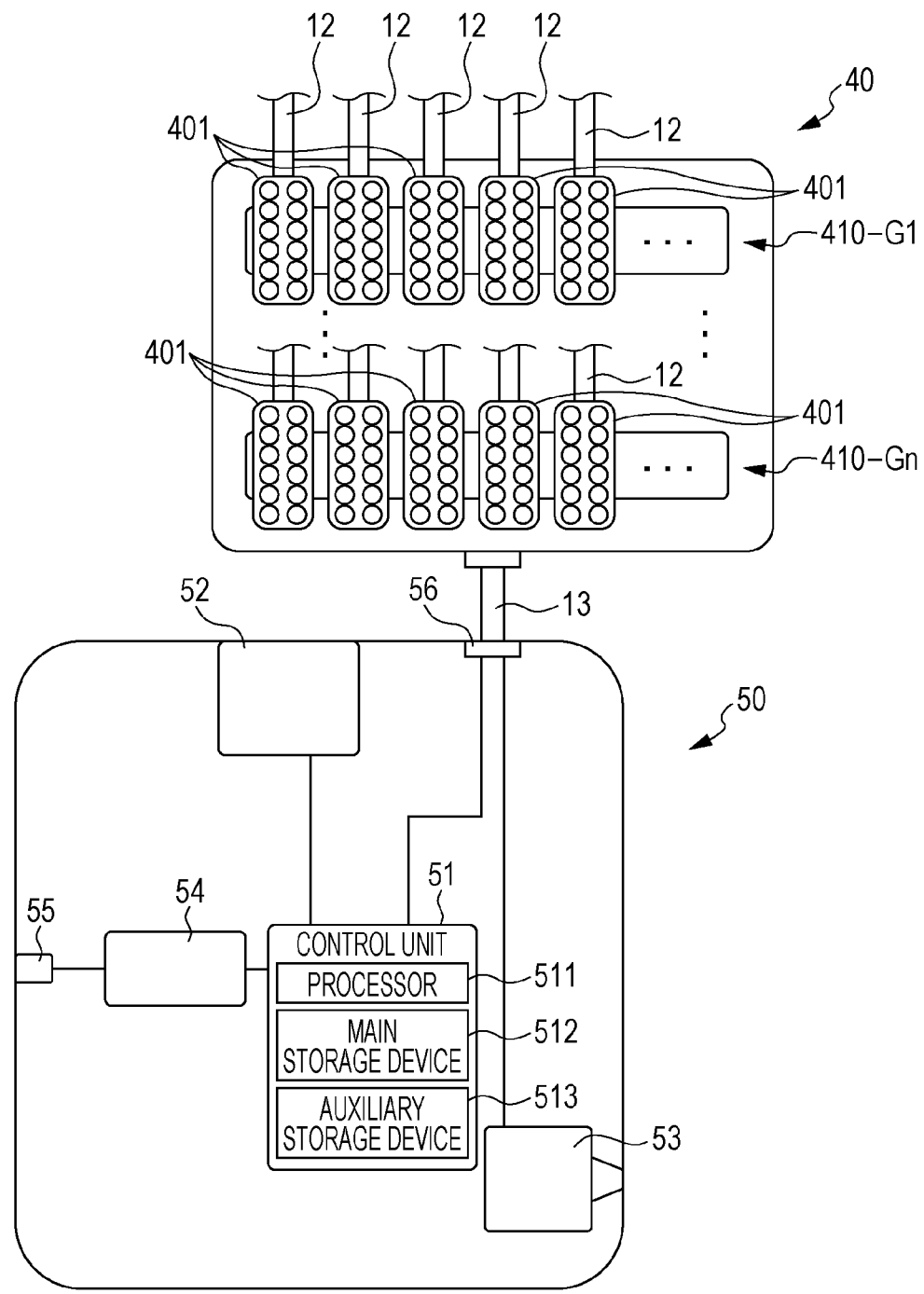
FIG. 11 depicts the structure of the connector box and a control device according to embodiment 1.
Figure 12:
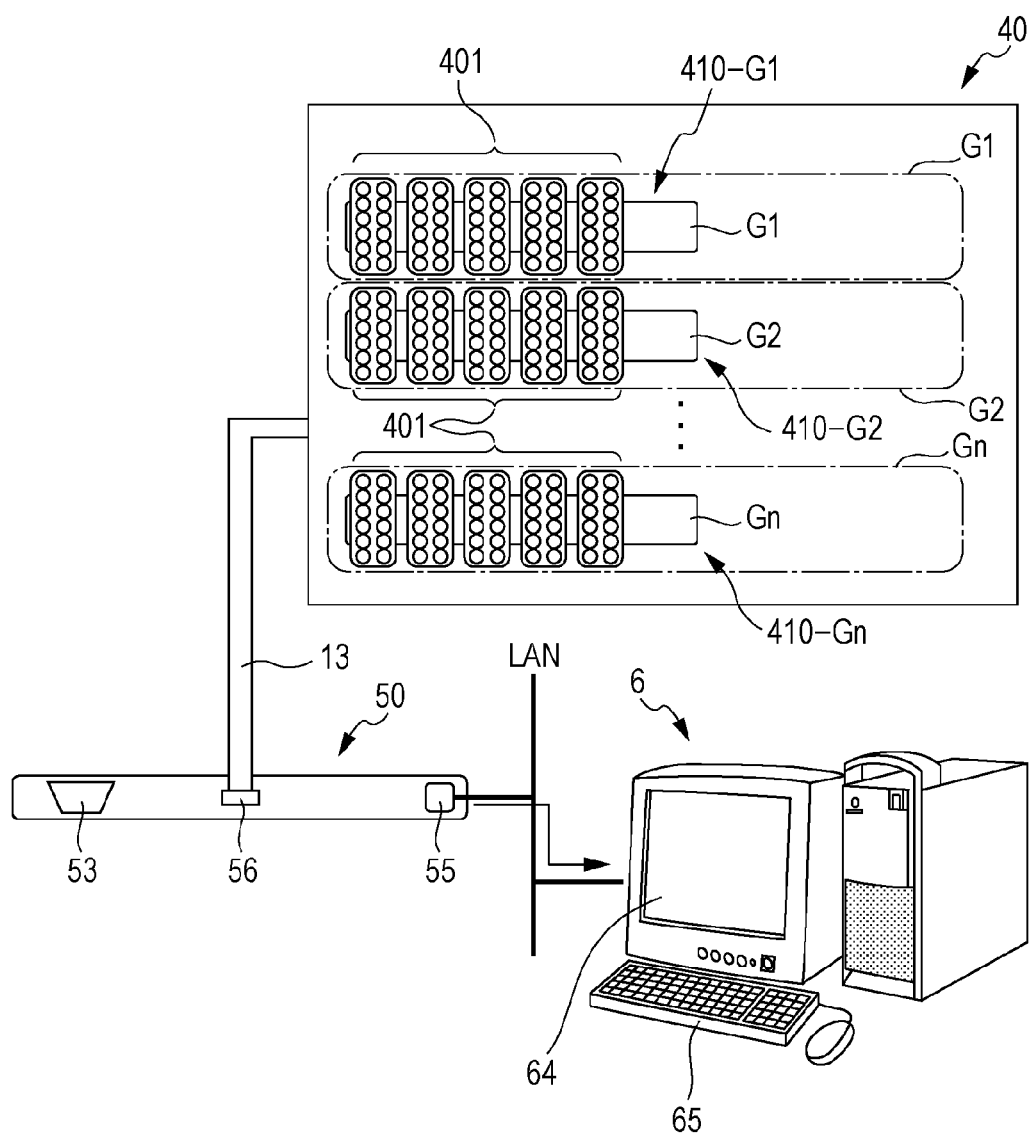
FIG. 12 depicts the structure of the connector box and the control device according to embodiment 1.

Next, the connector box 40 and the control device 50 placed at the bottom of the rack 10 will be described. FIGS. 11 and 12 depict the hardware structure of the connector box 40 and the control device 50 according to embodiment 1. Many connectors 401 are disposed in the connector box 40. Each of the connectors 401 is connected to the second connector 305 disposed on the printed circuit board 303 of the fan unit 300 via a wiring cable 12. Connector groups 410 are disposed in the connector box 40 and each the connector groups includes a plurality of the connectors 401.

Although details will described later, in embodiment 1, a plurality of the cooling fans 31 disposed in the rack 10 are grouped into a plurality of control groups and, for each control group, the number of revolutions of the cooling fans 31 is controlled. As many connector groups 410 as the control groups of the cooling fans 31 are prepared in the connector box 40. The plurality of control groups are represented as a first control group G1, a second control group G2, . . . , a n-th control group Gn. The connector groups 410 corresponding to the first control group G1, the second control group G2, . . . , the n-th control group Gn are represented as a first connector group 410-G1, a second connector group 410-G2, . . . , an n-th connector group 410-Gn, respectively. In the cooling apparatus 3 according to embodiment 1, the number of control groups during group control of the cooling fans 31 is arbitrary and may be set freely by the administrator (operator) of the server 1. The number of the cooling fans 31 attached to the fan socket 30 is also arbitrary. In addition, the control group with which the cooling fan 31 attached to the fan socket 30 is associated may also be freely set.

In FIG. 12, the wiring cables 12 connected to the connectors 401 disposed in the connector box 40 are not depicted. Each of the connector groups 410 (410-G1 to 410-Gn) in the connector box 40 is connected to a connector 56 of the control device 50 via the wiring cable 13. The control device 50 is a computer that performs fan group control in which the number of revolutions of the cooling fans 31 attached to the fan sockets 30 is controlled for each control group. As depicted in FIG. 11, the control device 50 includes a control unit 51, a temperature sensor 52, a power supply device 53, a communication controller 54, a communication port 55, and so on.

The control unit 51 is an information processing unit (computer) that includes a processor 511, a main storage device 512, an auxiliary storage device 513, and so on. The processor 511 is a central processing unit (CPU), for example. The main storage device 512 caches a program and data read by the processor 511 or develops the work area of the processor 511. Specifically, the main storage device 512 includes a read only memory (ROM), a random access memory (RAM), and so on. The auxiliary storage device 513 stores a program executed by the processor 511 and various types of data used by the processor 511. The auxiliary storage device 513 is a hard disk drive, a solid state drive, a flash memory, for example.

The communication port 55 is a receptacle for a network cable (LAN cable), for example. The communication controller 54 controls information communication (input/output) with other devices via the communication port 55. The communication controller 54 may be a LAN chip, for example. The temperature sensor 52 detects ambient temperature (referred to below as the ambient temperature) Tamb outside the rack 10. The temperature sensor 52 is connected to a control device 50 via electric wiring. The detection results of the temperature sensor 52 are stored in the main storage device 512 or the auxiliary storage device 513 of the control device 50 or the like. A power supply unit 53 is connected to an AC power source with an output voltage of, for example, 100 V. Then, the power supply unit 53 converts power supplied from the AC power source into DC power with a predetermined voltage (for example, 12V in embodiment 1) and supplies the converted power to a cooling unit 300 (the cooling fans 31).

Figure 13:
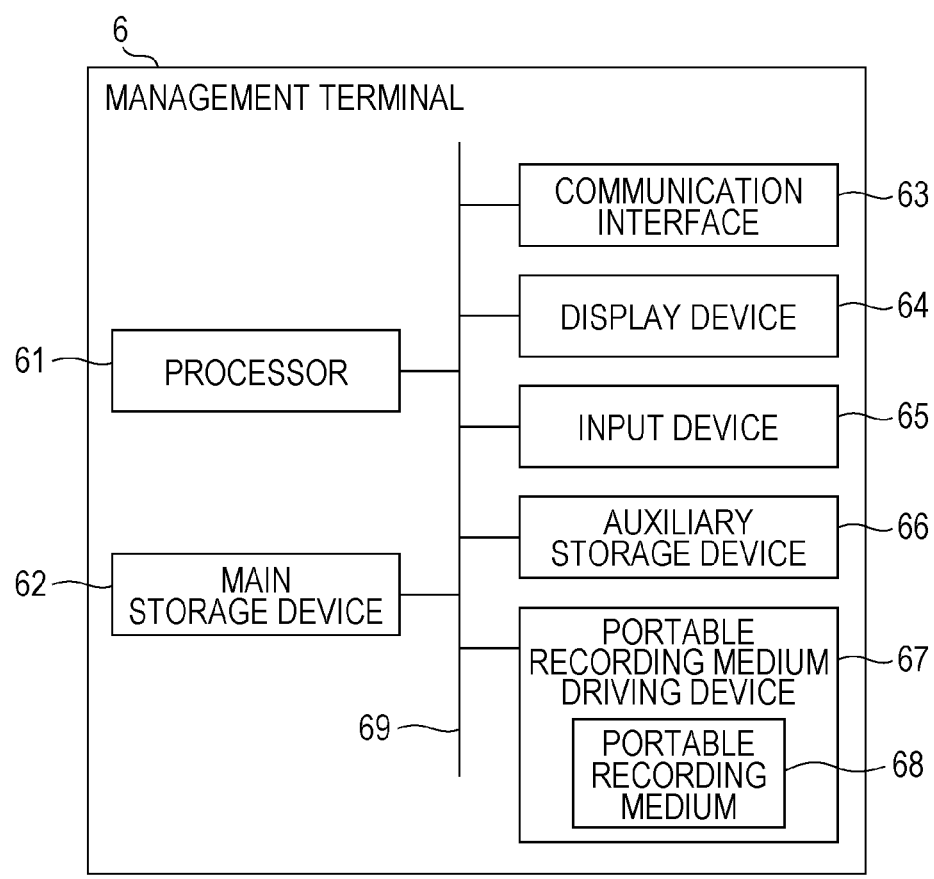
FIG. 13 depicts the hardware structure of a management terminal according to embodiment 1.

As depicted in FIG. 12, the control device 50 is connected to a management (monitoring) terminal 6 in a communicatable manner via a network. FIG. 13 depicts the hardware structure of the management terminal 6 according to embodiment 1. The management terminal 6 is an information processing apparatus (computer) that includes a processor 61, a main storage device 62, a communication interface 63, a display device (output device) 64, an input device 65, an auxiliary storage device 66, a portable recording medium driving device 67, a bus 69 that interconnects these components, and so on. The management terminal 6 may be a general-purpose computer.

The processor 61 of the management terminal 6 is a central processing unit (CPU), for example. The processor 61 performs various types of processing according to a program or the like stored in the main storage device 62. The main storage device 62, which includes a read only memory (ROM), a random access memory (RAM), and so on, caches a program and data read by the processor 61 or develops the work area of the processor 61. The communication interface 63 communicates (input/output) information with other devices via a network. The communication interface 63 is a local area network (LAN) adapter, for example. In embodiment 1, the management terminal 6 is able to communicate with the control device 50 of the cooling apparatus 3 via a network. The display device 64 is, for example, a cathode ray tube (CRT), liquid crystal display, plasma display, or electroluminescence display, or the like. The input device 65 is a pointing device such as, for example, a keyboard or mouse.

The auxiliary storage device 66 stores, for example, a program executed by the processor 61 or various types of data used by the processor 61. The auxiliary storage device 66 is a hard disk drive (HDD) or solid state drive (SSD), flash memory, for example. The portable recording medium driving device 67 drives a portable recording medium 68 and, depending on a signal from the processor 61, performs data input and output for the portable recording medium 68. The portable recording medium 68 is a recording medium such as, for example, a universal serial bus (USB) flash memory, compact disc (CD), or digital versatile disc (DVD).

Figure 14:
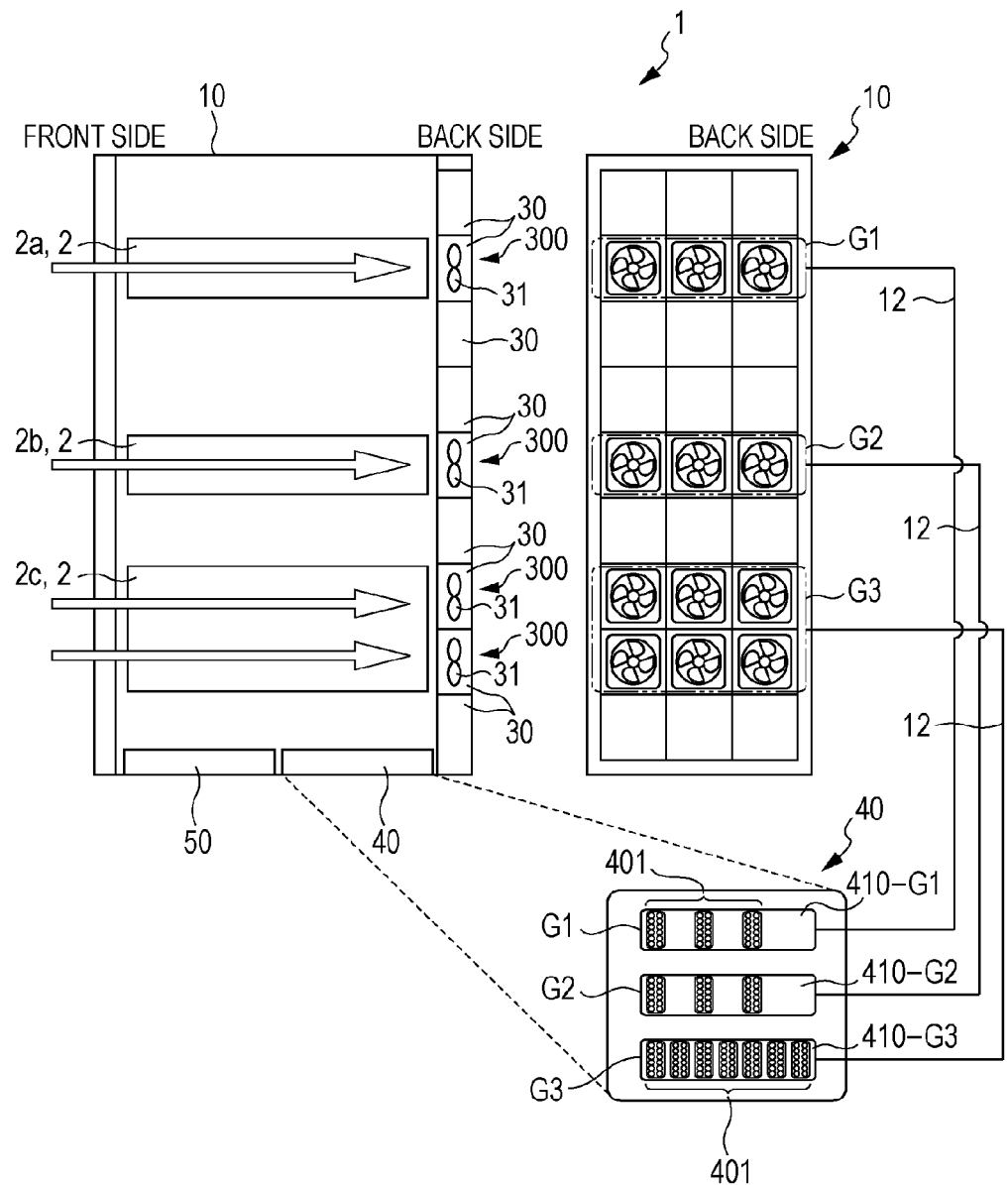
FIG. 14 depicts the correspondence between the control groups and the electronic apparatuses of a cooling apparatus according to embodiment 1.

Next, group control of the cooling fan 31 by the cooling apparatus 3 will be described in detail. FIG. 14 depicts the correspondence between electronic apparatuses and control groups of the cooling apparatus 3 according to embodiment 1. In FIG. 14, the three electronic apparatus 2 are stored in the rack 10. The three electronic apparatuses 2 are referred to as a first electronic apparatus 2a, a second electronic apparatus 2b, and a third electronic apparatus 2c from the top of the rack 10 to differentiate them. Since the cooling apparatus 3 has a plurality of the fan sockets 30, to which the cooling fans 31 are attached detachably, in a grid pattern on the back of the rack 10, it is possible to select the fan sockets 30 to which the cooling fans 31 are attached, in accordance with the installation positions of the electronic apparatuses 2. This enables the electronic apparatus 2 to be cooled efficiently.

Figure 15:
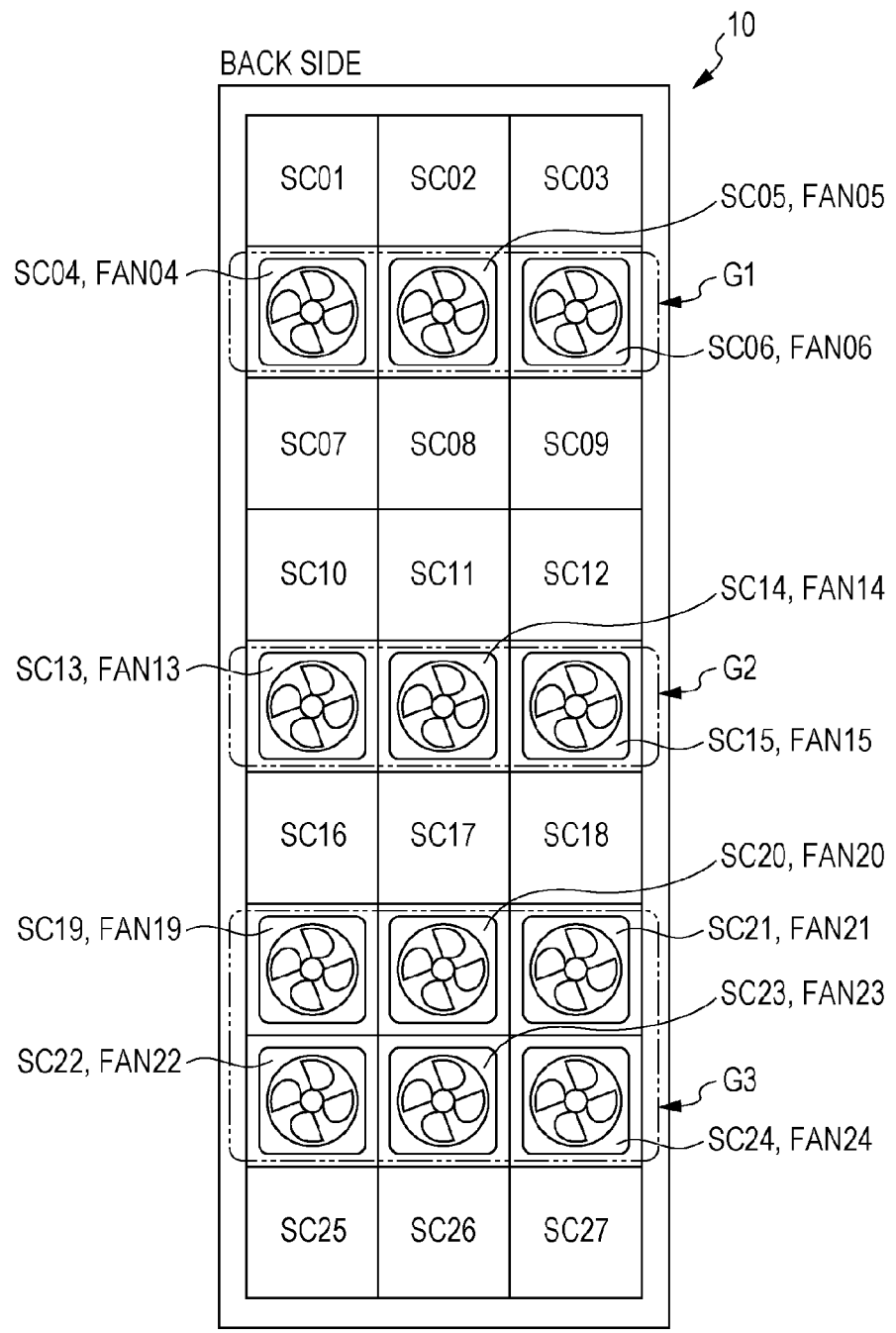
FIG. 15 depicts the correspondence between identification symbols assigned to the fan sockets and identification symbols assigned to the cooling fans.

FIG. 15, which is a rear view of the rack 10, depicts the correspondence between identification symbols assigned to the fan sockets 30 and identification symbols assigned to the cooling fans 31. SC01 to SC27 are identification symbols assigned to the 27 fan sockets 30. FAN01 to FAN27 are assigned to the cooling fans 31 and FAN01 to FAN27 correspond to SC01 to SC27, respectively.

In embodiment 1, as the cooling fans 31 for cooling a first electronic apparatus 2a, the cooling fans 31 (FAN04 to FAN06) are attached to the fan sockets 30 (SC04 to SC06), respectively, placed on the second step from the top. In addition, as the cooling fans 31 for cooling a second electronic apparatus 2b, the cooling fans 31 (FAN13 to FAN15) are attached to the fan sockets 30 (SC13 to SC15), respectively, placed on the fifth step from the top. In addition, as the cooling fans 31 for cooling a third electronic apparatus 2c, the cooling fans 31 (FAN19 to FAN24) are attached to the fan sockets 30 (SC19 to SC24), respectively, placed on the seventh and eighth steps from the top. In embodiment 1, for each of the electronic apparatuses 2 to be cooled, a control group of the cooling fans 31 is formed to group the cooling fans 31. In the example depicted in FIG. 14, the control group of the cooling fans 31 for cooling the first electronic apparatus 2a is assumed to be the first control group G1, which includes the three cooling fans 31 corresponding to FAN04 to FAN06. In addition, the control group of the cooling fans 31 for cooling the second electronic apparatus 2b is assumed to be the second control group G2, which includes the three cooling fans 31 corresponding to FAN13 to FAN15. In addition, the control group of the cooling fans 31 for cooling the third electronic apparatus 2c is assumed to be a third control group G3, which includes the six cooling fans 31 corresponding to FAN19 to FAN24.

As described above, in the cooling apparatus 3 according to embodiment 1, the cooling fans 31 attached to the fan sockets 30 on the back of the rack 10 are grouped into a plurality of control groups. Then, the cooling apparatus 3 performs group control in which the number of revolutions (rotation speed) of the cooling fans 31 is integrally controlled for each control group, attempting to improve the cooling efficiency of the electronic apparatus 2.

Grouping of the cooling fans 31 is performed in the following procedure. That is, when connecting the wiring cables 12 corresponding to the cooling fans 31 to the connectors 401 of the connector box 40, the operator only has to connect the wiring cables 12 to the connectors 401 included in the connector group 410 corresponding to the control group of the cooling fans 31. In the example depicted in FIG. 14, the first connector group 410-G1 to the third connector group 410-G3 corresponding to the first control group G1 to the third control group G3 are provided in the connector box 40. Then, the operator connects the wiring cables 12 from the cooling fans 31 corresponding to FAN04 to FAN06 that have to belong to the first control group G1 to the connectors 401 included in the first connector group 410-G1. Similarly, the operator connects the wiring cables 12 from the cooling fans 31 corresponding to FAN13 to FAN15 that have to belong to the second control group G2 to the connectors 401 included in the second connector group 410-G2. Then, the operator connects the wiring cables 12 from the cooling fans 31 corresponding to FAN19 to FAN24 that have to belong to the third control group G3 to the connectors 401 included in the third connector group 410-G3. Since the number of paths during division of the cooling fans 31 into a plurality of control groups is arbitrary, more connector groups 410 may be prepared in the connector box 40.

A unique address signal assigned to each of the cooling fans 31 is input to the control unit 51 of the control device 50 via the wiring cables 12 and 13. The control unit 51 of the control device 50 obtains the position information of the cooling fans 31 based on the input address signal. As a result, the control unit 51 is able to obtain the group setting information of the cooling fans 31 belonging to each control group. Specifically, the control unit 51 recognizes that the cooling fans 31 corresponding to FAN04 to FAN06 are set in the first control group G1 based on an address signal input through the first connector group 410-G1 corresponding to the first control group G1. Similarly, the control unit 51 recognizes that the cooling fans 31 corresponding to FAN13 to FAN15 are set in the second control group G2 based on an address signal input through the second connector group 410-G2 corresponding to the second control group G2. Then, the control unit 51 recognizes that the cooling fans 31 corresponding to FAN19 to FAN24 are set in the third control group G3 based on an address signal input through the third connector group 410-G3 corresponding to the third control group G3. As described above, the control unit 51 of the control device 50 is able to identify the correspondence between the cooling fans 31 and the control groups based on address signals of the cooling fans 31 selectively connected to the connector group 410 of the connector box 40.

Upon obtaining group setting information about the control groups of the cooling fans 31, the control unit 51 of the control device 50 stores the group setting information in a group information table TB stored in the auxiliary storage device 513. FIG. 16 is a data structure diagram depicting an example of the group information table TB. The group information table TB depicted in FIG. 16 is prepared for each control group and stores cooling fan information and adjacent group set number information corresponding to the control group. Adjacent group set number information indicates the number of a control group (referred to below as an adjacency control group) adjacent to the control group corresponding to the group information table TB. The group information table TB in FIG. 16 stores adjacent group set number information and cooling fan information about the first control group G1.

Although definition for determining whether control groups are adjacent to each other is not limited to a specific example, whether two control groups are adjacent to each other is determined using steps of the fan sockets 30 in this example. In the example depicted in FIG. 14, the cooling fans 31 corresponding to the first control group G1 are attached to the fan sockets 30 placed on the second step from the top. On the other hand, no cooling fans 31 are attached to the fan sockets 30 (SC01 to SC03) corresponding to the first step, which is immediately above, and the fan sockets 30 (SC07 to SC09) corresponding to the third step, which is immediately below. According to the above definition, in the example depicted in FIG. 14, there is no control group that satisfies the condition under which adjacency to the first control group G1 determined. Accordingly, a null value indicating that no data is present is stored in the field of adjacent group set number information corresponding to the first control group G1 in the group information table TB depicted in FIG. 16.

Next, cooling fan information stored in the group information table TB will be described. Cooling fan information includes data items such as a fan number, a reference number of revolutions Nb (rpm), a first reference temperature Tb1 (° C.), and a second reference temperature Tb2 (° C.).

As described above, the control unit 51 of the control device 50 identifies the cooling fans 31 belonging to each control group based on the address signals A0 to A5 input through the connector box 40. Then, the control unit 51 stores the data corresponding to the identification symbols of the cooling fans 31 corresponding to each control group, in the fields in the group information table TB that correspond to the fan number. Accordingly, as depicted in FIG. 16, for the first control group G1, the fields corresponding to the fan number store FAN04, FAN05, and FAN06. Although not depicted in FIG. 16, for the second control group G2, the fields corresponding to the fan number store FAN13 to FAN15 and, for the third control group G3, the fields corresponding to the fan number store FAN19 to FAN24.

Next, the reference number of revolutions Nb and the first and second reference temperatures Tb1 and Tb2, which are stored in the group information table TB as cooling fan information, will be described. The reference number of revolutions Nb is a threshold used to determine whether the cooling fan 31 fails (rotation abnormality). The first reference temperature Tb1 is a reference (threshold) temperature used to determine whether the cooling fans 31 belonging to a target control group is stopped (suspended). The second reference temperature Tb2 is a reference (threshold) temperature used to determine whether the duty ratio (%) used when the number of revolutions of the cooling fans 31 is controlled by pulse width modulation (PWM) is set to 100%. Although the first reference temperature Tb1 and the second reference temperature Tb2 are thresholds set for each control group in embodiment 1, the first reference temperature Tb1 and the second reference temperature Tb2 may be set for each cooling fan. In addition, the reference number of revolutions Nb is set for each of the cooling fans 31. Details on the reference number of revolutions Nb and the first and second reference temperatures Tb1 and Tb2 will be described in detail later.

The group control of the cooling fans 31 according to embodiment 1 is performed by the control unit 51 of the control device 50. As described above, the group control characterized by controlling the number of revolutions (rotation speed) of the cooling fans 31 for each control group. More specifically, the control unit 51 controls the number of revolutions of the cooling fans 31 for each control group in accordance with a group typical temperature Tgr, which typifies a control group to which the cooling fans 31 belong. The group typical temperature Tgr is an example of the group temperature.

The group typical temperature Tgr is calculated by equation (1) below.

$$Tgr = MAX(Tid1, Tid2, \ldots) - Tamb \qquad (1)$$

In this equation, Tid1, Tid2, . . . represent individual temperatures Tid detected by the temperature sensors 306 corresponding to the cooling fans 31 in the same control group. The ambient temperature Tamb is detected by the temperature sensor 52 of the control device 50. The group typical temperature Tgr is calculated by subtracting the ambient temperature Tamb from the maximum value of the individual temperatures Tid in the same control group.

In group control of the cooling fans 31, the control unit 51 of the control device 50 calculates the group typical temperature Tgr for each control group. For example, the group typical temperature Tgr of the first control group G1 is calculated by subtracting the ambient temperature Tamb from the maximum value of the individual temperatures Tid corresponding to FAN04 to FAN06 belonging to the first control group G1. Similarly, the group typical temperature Tgr of the second control group G2 is calculated by subtracting the ambient temperature Tamb from the maximum value of the individual temperatures Tid corresponding to FAN13 to FAN15 belonging to the second control group G2. In addition, the group typical temperature Tgr of the third control group G3 is calculated by subtracting the ambient temperature Tamb from the maximum value of the individual temperatures Tid corresponding to FAN19 to FAN24 belonging to the third control group G3.

After calculating the group typical temperature Tgr for each control group, the control unit 51 of the control device 50 determines the duty ratio Dpwm (%) used during pulse width modulation (PWM) of the number of revolutions of the cooling fans 31 based on the calculated group typical temperature Tgr.

Figure 17:
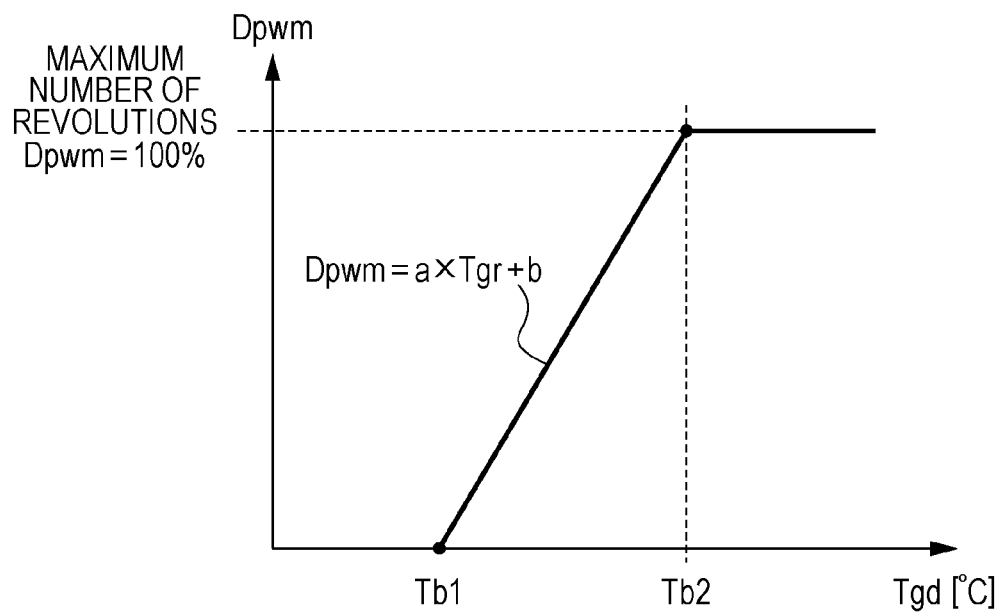
FIG. 17 depicts the relationship between the group typical temperature and the duty ratio of the cooling fan.

FIG. 17 depicts the relationship between the group typical temperature Tgr and the duty ratio Dpwm of the cooling fan 31. If the group typical temperature Tgr is more than the first reference temperature Tb1 and less than the second reference temperature Tb2, the duty ratio Dpwm is calculated by equation (2) below.

$$Dpwm\ (\%)=a \times Tgr+b(\text{where ``}a\text{'' and ``}b\text{'' are constants and } Tb1<Tgr<Tb2) \quad (2)$$

If the group typical temperature Tgr is equal to or less than the first reference temperature Tb1, the duty ratio Dpwm is set to 0% as indicated by equation (3) below. If the group typical temperature Tgr is equal to or more than the second reference temperature Tb2, the duty ratio Dpwm is set to 100% as indicated by equation (4) below.

$$Dpwm\ (\%)=0(\text{however, } Tgr \leq Tb1) \quad (3)$$

$$Dpwm\ (\%)=100(\text{however, } Tgr \geq Tb2) \quad (4)$$

As depicted above, the first reference temperature Tb1 is a reference (threshold) temperature used to determine whether the cooling fans 31 belonging to a target control group are stopped (suspended). If the group typical temperature Tgr is equal to or less than the first reference temperature Tb1, the control unit 51 stops the cooling fans 31 belonging to the control group corresponding to the group typical temperature Tgr. The first reference temperature Tb1 may be determined experientially as a temperature indicating that the temperature of the electronic apparatus 2 does not rise excessively even if the cooling fans 31 are stopped as long as the group typical temperature Tgr is equal to or less than the first reference temperature Tb1. On the other hand, the second reference temperature Tb2 is a reference (threshold) temperature used to determine whether the duty ratio Dpwm used when the number of revolutions of the cooling fans 31 is controlled by pulse width modulation (PWM) is set to 100%. As described above, when the group typical temperature Tgr is equal to or more than the second reference temperature Tb2, the number of revolutions of the cooling fans 31 belonging to the control group is controlled so that the duty ratio Dpwm becomes 100%.

The above relationship between the above group typical temperature Tgr and the duty ratio Dpwm of the cooling fan 31 is only an example. The control unit 51 may store programs that are based on the algorithm indicated by equations (1) to (4) in the auxiliary storage device 513. The processor 511 of the control unit 51 execute the above program and calculates the duty ratio Dpwm based on the obtained individual temperatures Tid, the ambient temperature Tamb, the first reference temperature Tb1, and the second reference temperature Tb2 of the cooling fans 31. The first reference temperature Tb1 and the second reference temperature Tb2 may be read from the group information table TB.

The processor 511 of the control unit 51 determines (calculates) the duty ratio Dpwm of the cooling fans 31 for each control group and, based on the determined duty ratio Dpwm, controls, for each control group, the number of revolutions of the cooling fans belonging to the control group.

Specifically, when the group typical temperature Tgr of the first control group G1 was obtained as a temperature equal to or less than the first reference temperature Tb1, the duty ratio Dpwm of the cooling fans 31 (FAN 04 to FAN 06) belonging to the first control group G1 is controlled to 0%. This stops the rotation of the cooling fans 31 (FAN 04 to FAN 06) belonging to the first control group G1. If the group typical temperature Tgr of the second control group G2 is obtained as a temperature equal to or more than the second reference temperature Tb2, the duty ratio Dpwm of the cooling fans 31 (FAN 13 to FAN 15) belonging to the second control group G2 is controlled to 100%. If the group typical temperature Tgr of the third control group G3 is larger than the first reference temperature Tb1 and smaller than the second reference temperature Tb2, the duty ratio Dpwm of the cooling fans 31 (FAN 19 to FAN 24) belonging to the third control group G3 is controlled by equation (2). In this case, the duty ratio Dpwm of the cooling fans 31 belonging to the third control group G3 is controlled to a value with higher number of revolutions as the group typical temperature Tgr is higher in the range from 0 to 100%.

The relationship between the duty ratio Dpwm of the cooling fan 31 and the group typical temperature Tgr depicted in FIG. 17 is an example. For example, equation (2) represents the duty ratio Dpwm of the cooling fans 31 as a linear function that takes the group typical temperature Tgr as a variable, but the duty ratio Dpwm may be obtained by substituting the group typical temperature Tgr into another function.

Figure 18:
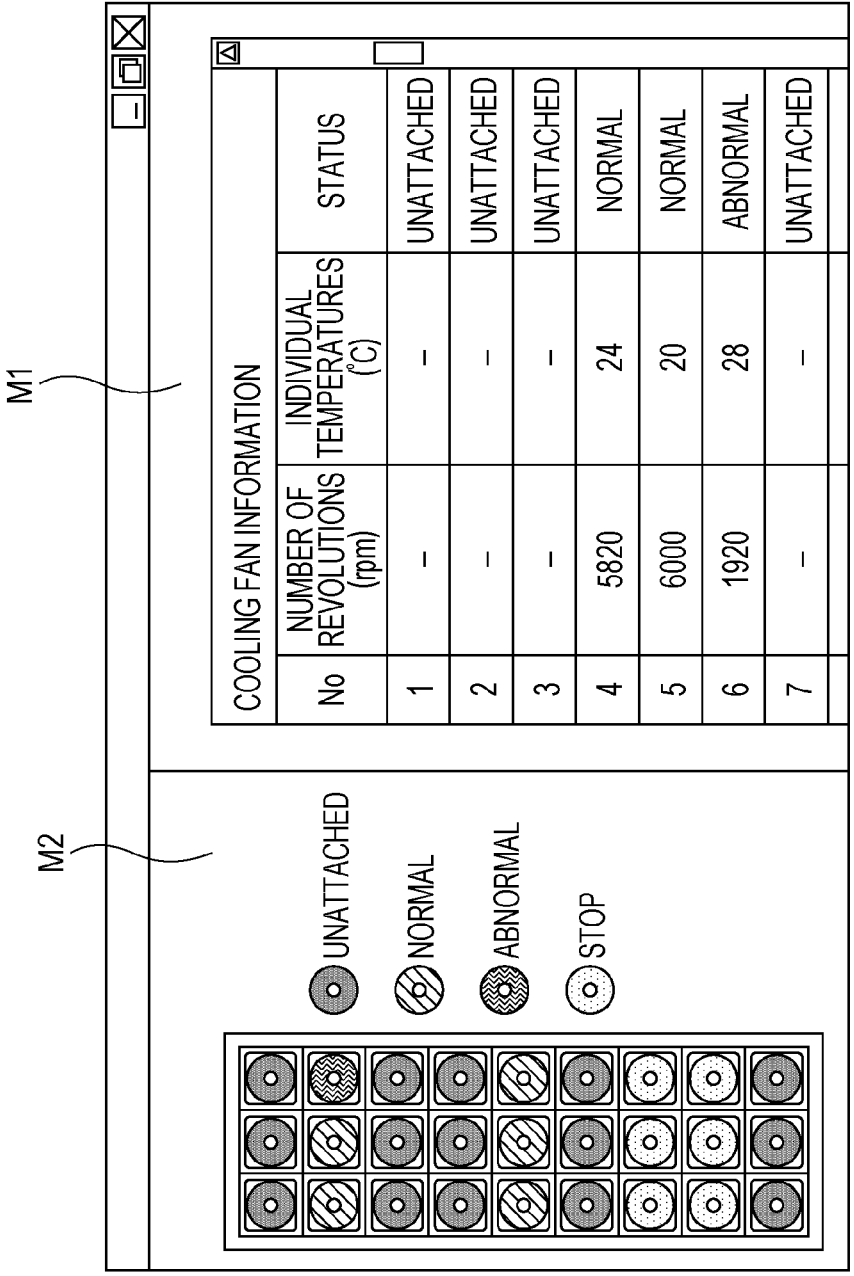
FIG. 18 depicts an example of a monitoring screen displayed in the display device of the management terminal.

The operational status of the cooling fans 31 related to the cooling apparatus 3 is monitored by the management terminal 6 connected to the control device 50 in a communicatable manner via a network. FIG. 18 depicts an example of the monitoring screen displayed in the display device 64 of the management terminal 6. In the display area M1 of the monitoring screen, the number of revolutions (rpm) of the cooling fans 31, the individual temperatures Tid corresponding to the cooling fans 31, and the current status are displayed in a tabular format.

In the "Status" field displayed in the monitoring screen of the display device 64, the rotation status of each of the cooling fans 31 and the status of attachment to the fan socket 30. "Unattached" indicates that the cooling fan 31 of the corresponding fan number is not attached to the fan socket 30. "Abnormal" indicates that the rotation status of the cooling fan 31 is abnormal. Specifically, "Abnormal" is displayed if the number of revolutions is equal to or less than the reference number of revolutions Nb when the duty ratio Dpwm to be output to the cooling fan 31 is not 0%. "Normal" indicates that the rotation status of the cooling fans 31 is normal. Specifically, "Normal" is displayed if the number of revolutions is more than the reference number of revolutions Nb when the duty ratio Dpwm to be output to the cooling fan 31 is not 0%.

The processor 511 of the control unit 51 obtains the number of revolutions of the cooling fans 31 based on the FAN PULSE signals output from the cooling fans 31. The processor 511 reads the reference number of revolutions Nb from the above group information table TB, compares the reference number of revolutions Nb with the number of revolutions of the cooling fan 31, and decides the status of the cooling fan 31. In the display area M2 of the screen displayed in FIG. 18, the statuses of the cooling fans 31 are indicated by icons. The icons corresponding to the cooling fans 31 indicate the current status of the cooling fans 31 using differences in appearance such as colors and patterns.

The reference number of revolutions Nb, the first reference temperature Tb1, the second reference temperature Tb2, and so on stored in the group information table TB depicted in FIG. 16 may be input via the input device 65 from the screen displayed in the display device 64 of the management terminal 6. If a predetermined operation is performed using an input device such as a keyboard or mouse on the monitoring screen depicted in FIG. 18, the processor 61 of the management terminal 6 causes the display device 64 to display an edit screen for editing various settings about cooling fan information.

Figure 19:
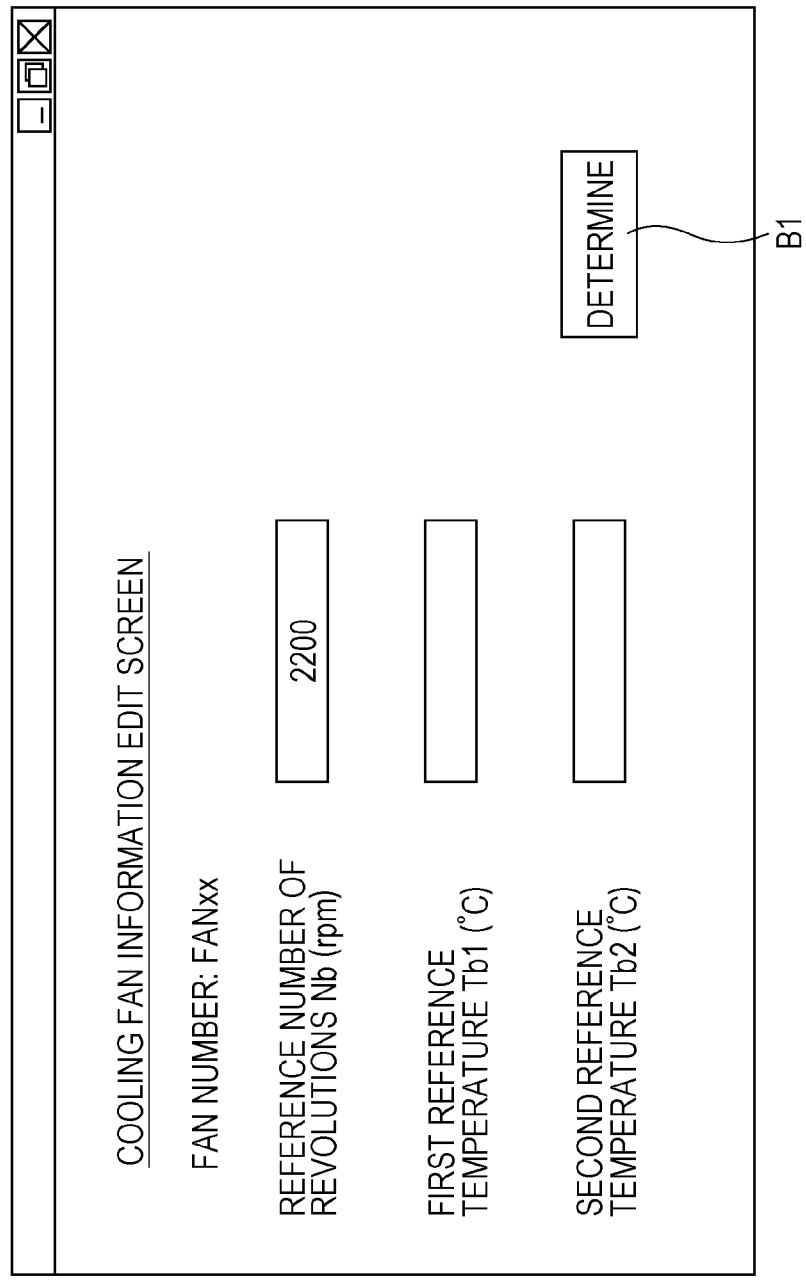
FIG. 19 depicts an example of an edit screen displayed in the display device of the management terminal.

For example, in the monitoring screen depicted in FIG. 18, the cursor is move to the fan number corresponding to the cooling fan 31 for which settings of cooling fan information are edited and, when the mouse is clicked, the processor 61 may display the edit screen depicted in FIG. 19 in the display device 64. Through the edit screen as depicted in FIG. 19, the operator is able to edit the settings of cooling fan information such as the reference number of revolutions Nb, the first reference temperature Tb1, and the second reference temperature Tb2. A DETERMINE button B1 is displayed on the edit screen depicted in FIG. 19. Upon detecting the depression of the DETERMINE button B1, the processor 61 of the management terminal 6 transmits the updated (edited) cooling fan information to the control device 50 from the communication interface 63. When the control unit 51 of the control device 50 receives the cooling fan information transmitted from the management terminal 6, the processor 511 of the control unit 51 updates data in the group information table TB stored in the auxiliary storage device 513.

Figure 20:
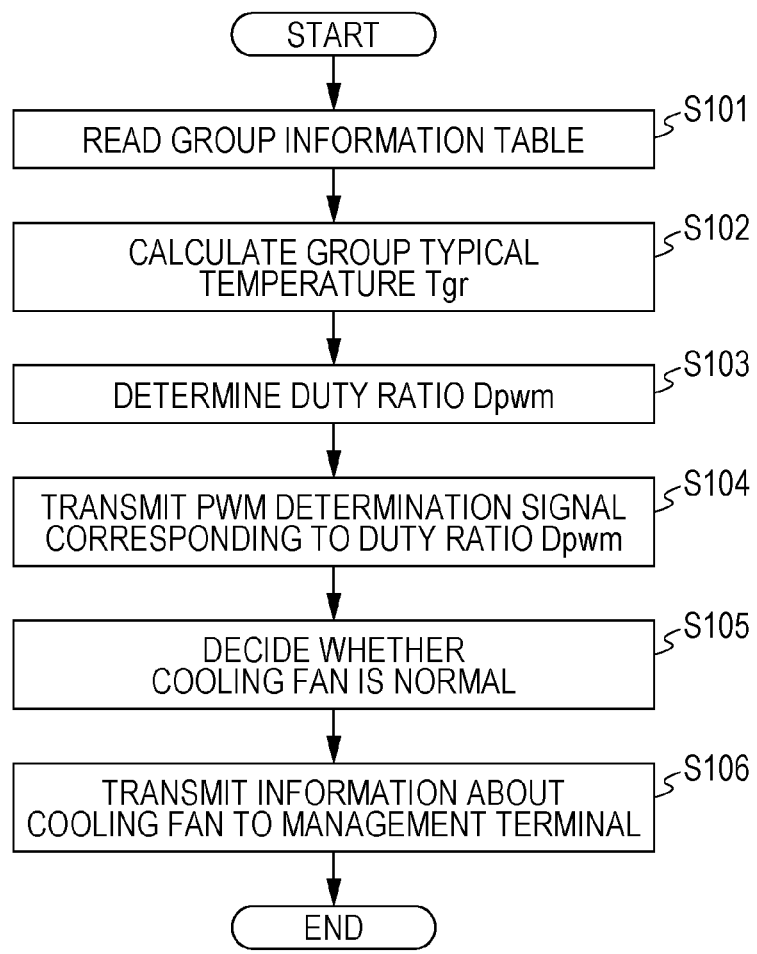
FIG. 20 is a flowchart depicting an example of processing performed by a processor of the control device.

Next, a processing flow performed by the processor 511 related to the control unit 51 of the control device 50 will be described. FIG. 20 is a flowchart depicting an example of processing performed by the processor 511 of the control device 50. The processing depicted in FIG. 20 is achieved by causing the processor 511 to execute a control program read from the auxiliary storage device 513 to the main storage device 512. This control program is executed by the processor 511 repeatedly at predetermined intervals while the control device 50 operates. The cooling method according to embodiment 1 includes obtaining the group typical temperature Tgr (group temperature) by a computer of the cooling apparatus 3 and controlling the rotation speed of the cooling fans 31 for each group in accordance with the group typical temperature Tgr.

In step S101, the processor 511 of the control unit 51 reads information stored in the group information table TB (see FIG. 16) stored in the auxiliary storage device 513 and identifies the cooling fan 31 belonging to each control group. In addition, the processor 511 obtains cooling fan information such as the reference number of revolutions Nb, the first reference temperature Tb1, and the second reference temperature Tb2 from the group information table TB.

In step S102, the processor 511 of the control unit 51 calculates the group typical temperature Tgr for each control group. The method for specifically calculating the group typical temperature Tgr has been described above. The processor 511 is able to obtain the individual temperatures Tid corresponding to the cooling fans 31 belonging to each control group based on the TEMP signal assigned to the second connector 305 of the printed circuit board 303.

In step S103, the processor 511 determines the duty ratio Dpwm (%) used when the number of revolutions of the cooling fans 31 belonging to each control group is subject to group control. The duty ratio Dpwm is obtained by assigning the group typical temperature Tgr for each control group to equations (2) to (4).

Next, in step S104, the processor 511 generates, for each control group, the PWM signal corresponding to the duty ratio Dpwm determined in step S103 using, for example, a pulse generator (not depicted). Then, the processor 511 transmits the generated PWM signal to the cooling fans 31 of each control group. This PWM signal is transmitted to the corresponding the cooling fans 31 for each control group through the connector box 40. The motors (not depicted) of the cooling fans 31 are controlled based on the PWM signal.

Next, in step S105, the processor 511 obtains the number of revolutions Nf of each cooling fan 31, based on the FAN PULSE signal output from the cooling fan 31. Then, the processor 511 decides whether the cooling fan 31 operates normally by comparing the number of revolutions Nf of the cooling fan 31 with the reference number of revolutions Nb. The processor 511 decides whether the number of revolutions Nf of the cooling fan 31 (that is, the cooling fan 31 to be operated) for which the duty ratio Dpwm of the PWM signal is not 0% is equal to or more than the reference number of revolutions Nb. Then, when the number of revolutions Nf of the cooling fan 31 is equal to or more than the reference number of revolutions Nb, the processor 511 decides that the cooling fan 31 operates normally. In contrast, when the number of revolutions Nf of the cooling fan 31 is less than the reference number of revolutions Nb, the processor 511 decides that the cooling fan 31 is abnormal (fails). In this step, the processor 511 decides whether all of the cooling fans 31 attached to the fan sockets 30 of the rack 10 operate normally. At this time, the processor 511 changes the indication of the LED display lamp 307 disposed in the printed circuit board 303 corresponding to the cooling fan 31 that has been decided to be abnormal, from "normal display" "abnormal display". Switching of this LED display lamp 307 is performed through the LED signal transmitted to the printed circuit board 303. For example, the appearance of the LED display lamp 307 may be changed from green which indicates a normal state to red which indicates an abnormal state.

The processor 511 proceeds to step S106 and transmits information (the number of revolutions Nf, the individual temperature Tid, and the status (abnormal, normal, unattached)) about each cooling fan 31 to the management terminal 6 via the communication controller 54. Upon receiving cooling fan information from the control device 50, the management terminal 6 updates the monitoring screen depicted in FIG. 18 based on the received cooling fan information. The communication controller 54 may transmit, to the management terminal 6, information indicating that the cooling fan 31 identified to be abnormal is abnormal by using an SNMP trap. Upon completion of the processing in step S106, the processor 511 finishes the control program related to this flowchart once.

As described above, the cooling apparatus 3 performs group control in which the number of revolutions (rotation speed) of the cooling fans 31 is controlled for each group in accordance with the group typical temperature Tgr that typifies the control group to which the cooling fans 31 belong. With this control, the electronic apparatus 2 may be cooled efficiently depending on the state in which the electronic apparatuses 2 are accommodated (installed) in the rack 10 or the heating state of the electronic apparatus 2. This improves the cooling efficiency of the electronic apparatuses 2 accommodated in the rack 10 of the server 1. If the group typical temperature Tgr is equal to or less than the first reference temperature Tb1 because, for example, the amount of heat generation of the electronic apparatus 2 belonging to each control group, then the power consumption may be reduced by stopping the cooling fans 31 belonging to the control group on a group-by-group basis.

Figure 1:
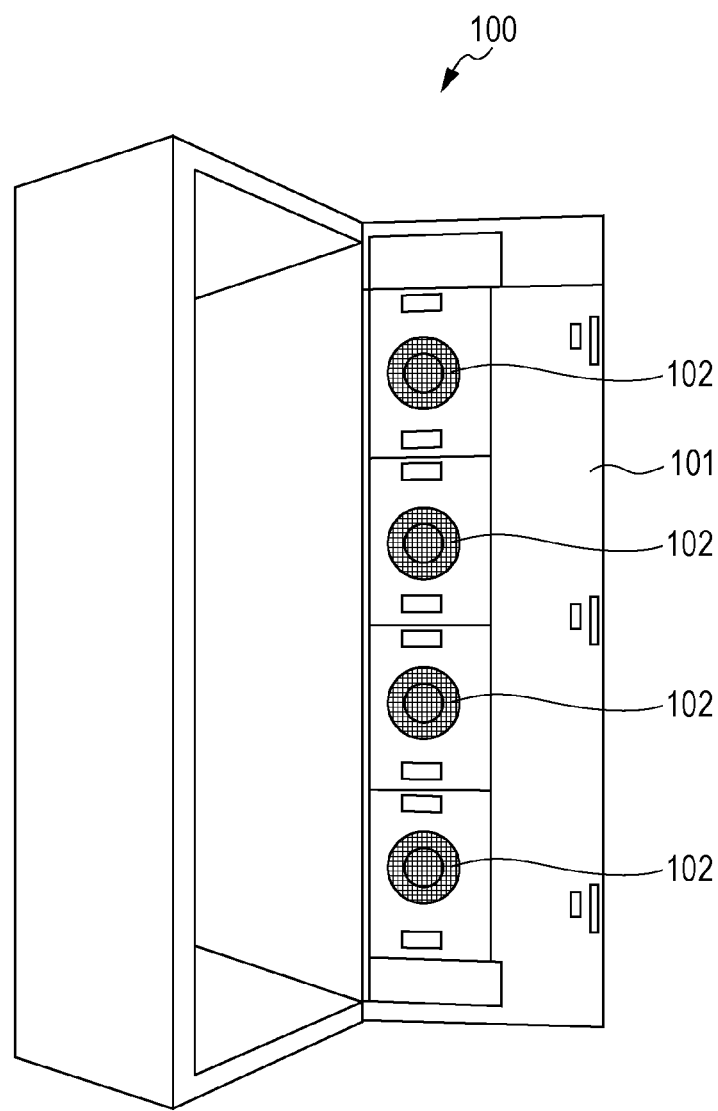
FIG. 1 depicts a server rack of related art.
Figure 21:
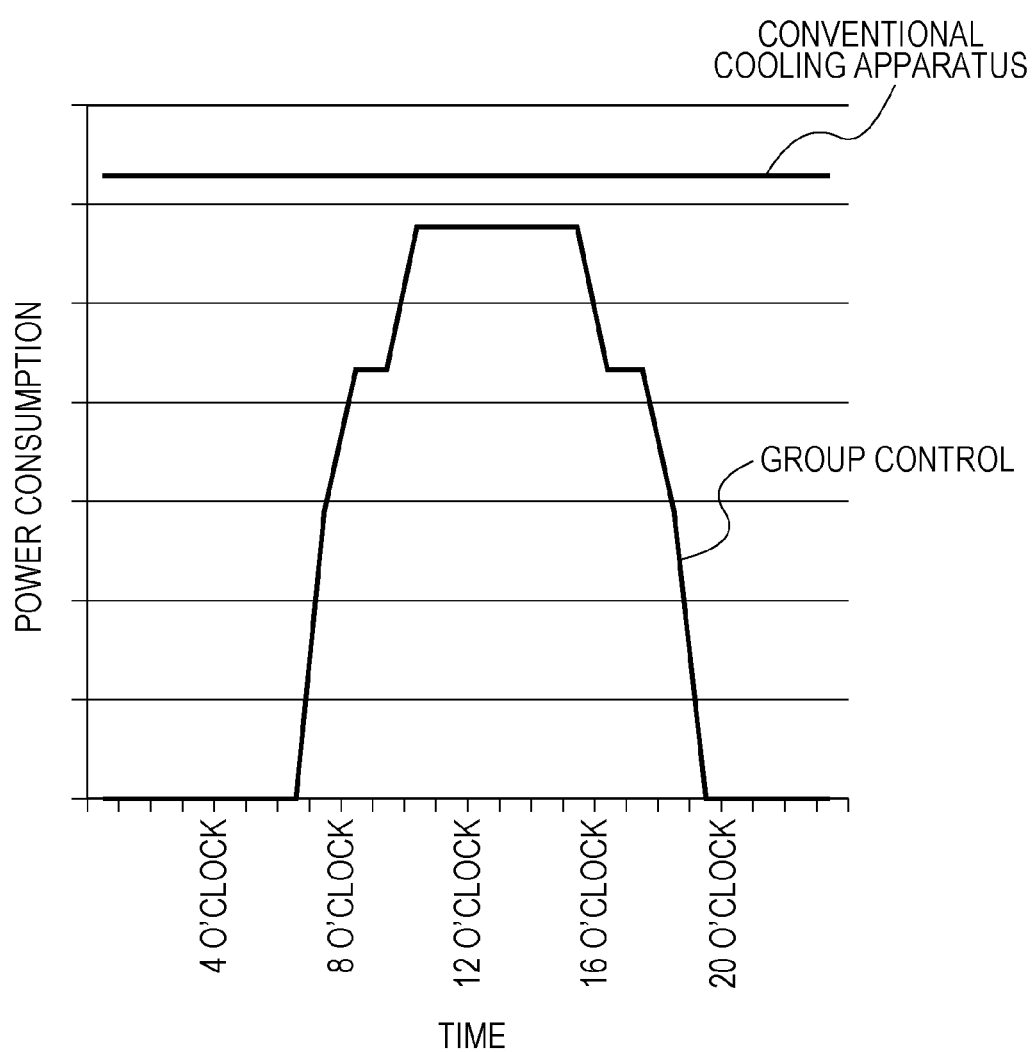
FIG. 21 depicts differences in power consumption between the cooling apparatus according to embodiment 1 and a cooling apparatus of related art.

FIG. 21 depicts differences in power consumption between the cooling apparatus 3 according to embodiment 1 and the cooling apparatus of related art depicted in FIG. 1. FIG. 21 depicts an example of the progression of the power consumption (W) of the cooling apparatus of related art and the cooling apparatus 3 measured when these cooling apparatuses operate for 24 hours. For the cooling apparatus of related art, the cooling fans are controlled to a certain number of revolutions regardless of the operational status (that is, the amount of heat generation) of the apparatuses accommodated in the rack. On the other hand, in the cooling apparatus 3 according to embodiment 1, it is assumed that FAN04 to FAN06 belonging to the first control group G1 are subject to the above group control at a certain number of revolutions from 10 o'clock to 16 o'clock. It is also assumed that FAN13 to FAN15 belonging to the second control group G2 are subject to group control at a certain number of revolutions from 8 o'clock to 18 o'clock and that FAN19 to FAN24 belonging to the third control group G3 are subject to group control at a certain number of revolutions from 7 o'clock to 19 o'clock. FIG. 21 depicts the progression of power consumption when the cooling fans are subject to group control under such conditions. It is easily found from FIG. 21 that the power consumption may be reduced by controlling the number of revolutions of the control fans for each control group in accordance with the group typical temperature Tgr as compared with the case where the number of revolutions of the cooling fans is controlled to a certain value regardless of the amount of heat generation of the electronic apparatuses.

As described above, in the cooling apparatus 3 according to embodiment 1, the number of revolutions of the cooling fans may be controlled for each control group in accordance with differences in the amount of heat generation depending on the types and variations in the amount of heat generation depending on the operational status of electronic apparatuses installed in the server 1. Accordingly, it is possible to efficiently cool the electronic apparatuses 2 installed in the server 1 and achieve reduction in power consumption.

In embodiment 1, the group typical temperature Tgr is set using, as a reference, the maximum temperature of the individual temperatures Tid obtained from the temperature sensors 306 disposed in the cooling fans 31 belonging to one control group. This makes the cooling of the electronic apparatuses 2 more efficiently. However, the calculation method for the group typical temperature Tgr is not limited to equation (1) described above. For example, the group typical temperature Tgr may be calculated by subtracting the ambient temperature Tamb from, for example, the average value of the individual temperatures Tid detected by the temperature sensors 306 corresponding to the cooling fans 31 in a single control group. Alternatively, the maximum temperature of the individual temperatures Tid obtained in a single control group may be defined as the group typical temperature Tgr. Alternatively, the average value of the individual temperatures Tid obtained in a single control group may be defined as the group typical temperature Tgr. As described above, various modifications are allowed for the method of setting the group typical temperature Tgr.

Since the cooling apparatus 3 according to embodiment 1 has the connector box 40 including a plurality of the connector groups 410 associated with the control group of the cooling fans 31, grouping of the cooling fans 31 attached to the fan sockets 30 becomes easy. That is, only if selecting the connector group 410 to which the wiring cables 12 corresponding to the cooling fans 31 in correspondence with the control group, the operator is able to group the cooling fan 31 easily. In particular, since the control unit 51 is able to obtain the positional information of the cooling fan 31 based on an address signal from the printed circuit board 303 disposed in each of the fan unit 300 in embodiment 1, it is easy to identify the control group to which the cooling fans 31 belong. The wiring cables 12 connected to the fan units 300 of the cooling fans 31 (the fan units 300) may be directly connected to the connectors 56 of the control device 50.

The cooling apparatus 3 according to embodiment 1 has a plurality of the fan sockets 30, which are holding units for holding the cooling fans 31 detachably on the back surface (one surface) of the rack 10. With this structure, according to the installation positions of the electronic apparatuses 2 accommodated in the rack 10, the cooling fans 31 may be attached to the fan sockets 30. Accordingly, the electronic apparatus 2 may be cooled efficiently. Since the cooling fans 31 are attached to the fan sockets 30 detachably, the number of the cooling fans 31 may be increased or reduced depending on the rate of installation of the electronic apparatuses 2 in the rack 10. This enables the electronic apparatuses 2 to be efficiently cooled and the power consumption to be reduced.

Modification

Figure 22:
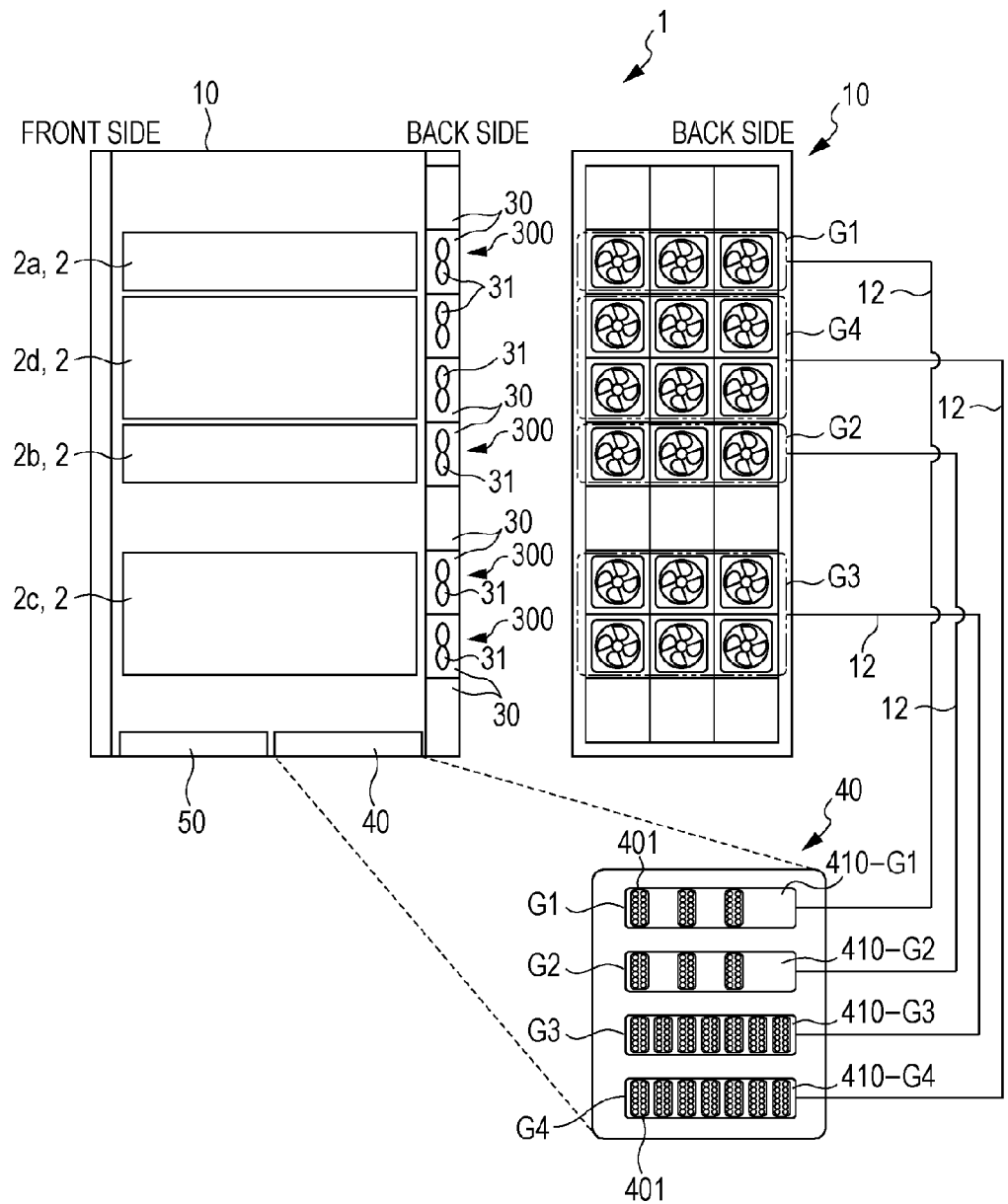
FIG. 22 depicts the correspondence between control groups and electronic apparatuses of a cooling apparatus according to a modification.

Here, it is assumed that the electronic apparatus 2 is newly accommodated in the rack 10 in the status depicted in FIG. 14. FIG. 22 depicts the correspondence between electronic apparatuses and control groups of the cooling apparatus 3 according to a modification. In the example depicted in FIG. 22, a fourth electronic apparatus 2d is installed between the first electronic apparatus 2a and the second electronic apparatus 2b and its height corresponds to that of the fan sockets 30 (SC07 to SC12) on the third and fourth steps from the top on the back of the rack 10. Accordingly, in the second structure example, the cooling fans 31 (FAN07 to FAN12) that cool a fourth electronic apparatus 2d are attached to the SC07 to SC12. FAN07 to FAN12 that have been added to the first structure example depicted in FIG. 14 are newly grouped into a fourth control group G4. At this time, in the cooling apparatus 3, since a plurality of connector groups 410 are placed in the connector box 40, the grouping of the cooling fans 31 is easy even when the electronic apparatus 2 is added in the rack 10. That is, it is possible to perform grouping as a new control group compiling the added FAN07 to FAN12 by connecting the fourth connector group 410-G4 corresponding to the fourth control group G4 to FAN07 to FAN12 belonging to the fourth control group G4 in correspondence with each other.

Although the grouping of the cooling fans 31 attached to the fan sockets 30 is performed in units of steps of the fan sockets 30 in embodiment 1, this disclosure is not limited to this method. For example, the cooling fans 31 corresponding to FAN01 and FAN02 may be set as the first control group G1 and the cooling fans 31 corresponding to FAN03 and FAN06 may be set as the second control group G2. Various methods for grouping the cooling fans 31 are allowed. Although whether two control groups are adjacent to each other is determined in units of steps of the fan sockets 30 in embodiment 1, this disclosure is not limited to this method. When, for example, two control groups are placed so as to sandwich the step of the fan sockets 30 to which no cooling fans 31 are attached, the two control groups may be assumed to be adjacent to each other. For the setting of an adjacency control group for each control group, an operation by the input device 65 may be accepted through the edit screen in the display device 64 of the management terminal 6. Then, when the management terminal 6 accepts a change in adjacent group set number information for any control group, the group information table TB stored in the auxiliary storage device 513 of the control device 50 may be updated.

Embodiment 2

Figure 23:
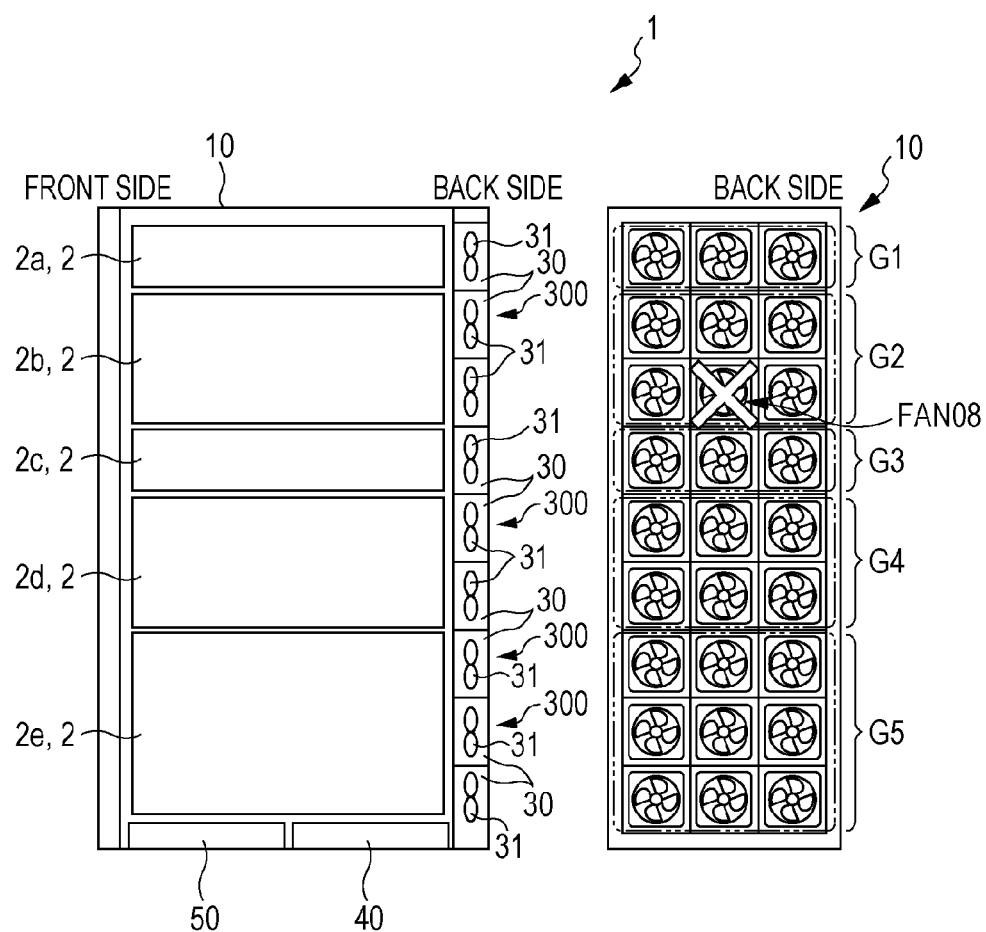
FIG. 23 depicts the correspondence between control groups and electronic apparatuses of a cooling apparatus according to embodiment 2.

Next, the cooling apparatus 3 according to embodiment 2 will be described. FIG. 23 depicts the correspondence between electronic apparatuses and control groups of the cooling apparatus 3 according to embodiment 2. As depicted in FIG. 23, the five electronic apparatuses 2 (the first electronic apparatus 2a to the fifth electronic apparatus 2e) are accommodated (installed) in the rack 10. The height of the first electronic apparatus 2a corresponds to that of the fan sockets 30 (SC01 to SC03) on the first step from the top. The height of the second electronic apparatus 2b corresponds to that of the fan sockets 30 (SC04 to SC09) on the second and third steps from the top. The height of the third electronic apparatus 2c corresponds to that of the fan sockets 30 (SC10 to SC12) on the fourth step from the top. The height of the fourth electronic apparatus 2d corresponds to that of the fan sockets 30 (SC13 to SC18) on the fifth and sixth steps from the top. The height of the fifth electronic apparatus 2e corresponds to that of the fan sockets 30 (SC19 to SC27) on the seventh to ninth steps from the top. The hardware structure of the cooling apparatus 3 according to embodiment 2 is similar to that of embodiment 1.

The cooling fans 31 for cooling the first electronic apparatus 2a are attached to the fan sockets 30 corresponding to SC01 to SC03 and the attached cooling fans 31 (FAN01 to FAN03) are set as the first control group G1. The cooling fans 31 for cooling the second electronic apparatus 2b are attached to the fan sockets 30 corresponding to SC04 to SC09 and the attached cooling fans 31 (FAN04 to FAN09) are set as the second control group G2. The cooling fans 31 for cooling the third electronic apparatus 2c are attached to the fan sockets 30 corresponding to SC10 to SC12 and the attached cooling fans 31 (FAN10 to FAN12) are set as the third control group G3. The cooling fans 31 for cooling the fourth electronic apparatus 2d are attached to the fan sockets 30 corresponding to SC13 to SC18 and the attached cooling fans 31 (FAN13 to FAN18) are set as the fourth control group G4. The cooling fans 31 for cooling the fifth electronic apparatus 2e are attached to the fan sockets 30 corresponding to SC19 to SC27 and the attached cooling fans 31 (FAN19 to FAN27) are set as the fifth control group G5.

Although the wiring cables 12 are not depicted in FIG. 23, the wiring cables 12 to be connected to the cooling fans 31 are connected to the connectors 401 of the connector box 40 as in embodiment 1. The cooling fans 31 (FAN01 to FAN03) belonging to the first control group G1 are connected to the connectors 401 in the first connector group 410-G1 of the connector box 40. The cooling fans 31 (FAN04 to FAN09) belonging to the second control group G2 are connected to the connectors 401 in the second connector group 410-G2 of the connector box 40. The cooling fans 31 (FAN10 to FAN12) belonging to the third control group G3 are connected to the connectors 401 in the third connector group 410-G3 of the connector box 40. The cooling fans 31 (FAN13 to FAN18) belonging to the fourth control group G4 are connected to the connectors 401 in the fourth connector group 410-G4 of the connector box 40. The cooling fans 31 (FAN19 to FAN27) belonging to the fifth control group G5 are connected to the connectors 401 in the fifth connector group 410-G5 of the connector box 40.

Next, the group control of the cooling fans 31 in embodiment 2 will be described. In embodiment 2, the number of revolutions of the cooling fans belonging to each control group is controlled in more detail than in embodiment 1. In describing the group control of the cooling fans 31 according to embodiment 2, the group control described in embodiment 1 is referred to as independent control. As described above, independent control controls the number of revolutions of the cooling fans 31 to be controlled, for each control group in accordance with the group typical temperature Tgr of the control group to which the cooling fans 31 belong. That is, in independent control, the number of revolutions of the cooling fans 31 is controlled independently of other control groups.

In group control according to embodiment 2, independent control similar to that in embodiment 1 is basically performed, but coordinated control described below is performed when a certain condition is met. In coordinated control, depending on both the group typical temperature Tgr corresponding to one control group and the number of revolutions of the cooling fans 31 belonging to another control group, the number of revolutions of the cooling fans 31 belonging to the one control group is controlled. In embodiment 2, coordinated control is performed with the other control group above assumed to be an adjacency control group that is adjacent to the one control group. That is, in coordinated control, the number of revolutions of the cooling fans 31 belonging to one control group is controlled in accordance with the corresponding group typical temperature Tgr and the number of revolutions of the cooling fans 31 belonging to the adjacency control group.

In coordinated control, the duty ratio Dpwm obtained in accordance with the group typical temperature Tgr is corrected based on equations (2) to (4) described in embodiment 1 is corrected in accordance with the number of revolutions of the cooling fans 31 belonging to an adjacency control group. In independent control, the number of revolutions of the cooling fans 31 is controlled without correcting the duty ratio Dpwm obtained based on equations (2) to (4). In the present embodiment, the number of revolutions of the cooling fans 31 in one control group is controlled in coordinated control mode if the number of revolutions of the cooling fans 31 belonging to an adjacency control group is equal to or more than a first threshold. If the number of revolutions of the cooling fans 31 belonging to the adjacency control group is less than the first threshold, the cooling fans 31 in one control group is controlled in independent control mode. Although the first threshold is set to the maximum number of revolutions of the cooling fans 31 here, the setting of the first threshold may be changed. The maximum number of revolutions of the cooling fans 31 is the number of revolutions of the cooling fans 31 that corresponds to the duty ratio 100%. In coordinated control, the duty ratio calculated based on equations (2) to (4) in one control group is increased when the duty ratio of the cooling fans 31 in an adjacency control group is 100%. Although the extra rate for increasing the duty ratio may be changed as appropriate, the duty ratio of the cooling fan 31 is set to increase 5% in the present embodiment.

In the example depicted in FIG. 23, the adjacency control group adjacent to the first control group G1 is the second control group G2. Accordingly, when the duty ratio of the cooling fans 31 of the second control group G2 adjacent to the first control group G1 becomes 100%, the control mode of the first control group G1 is shifted from independent control mode to coordinated control mode. The adjacency control groups of the second control group G2 are the first control group G1 and the third control group G3. Accordingly, when the duty ratio of the cooling fans 31 belonging to the first control group G1 or the third control group G3 adjacent to the second control group G2 becomes 100%, the control mode of the second control group G2 is shifted from independent control mode to coordinated control mode.

It is assumed that, for example, the cooling fan 31 corresponding to FAN08 belonging to the second control group G2 depicted in FIG. 23 fails. In this case, the cooling capacity of the entire second control group G2 that cools the second electronic apparatus 2b becomes smaller than in the case where the cooling fan 31 corresponding to FAN08 operates normally. In independent control described above, as the group typical temperature Tgr corresponding to the second control group G2 rises, the duty ratio of the cooling fans 31 is increased. However, after the duty ratio is increased to 100%, it is not possible to further increase the cooling capacity of the control group. In such a case, the control mode of the first control group G1 and the third control group G3 adjacent to the second control group is switched from independent control mode to coordinated control mode to increase the number of revolutions of the corresponding cooling fans 31 by a predetermined amount. Consequently, cooling of the second electronic apparatus 2b by the second control group G2 may be assisted by the first control group G1 and the third control group G3, which are adjacent to the second control group G2, thereby suppressing lack of the cooling capacity for the second electronic apparatus 2b.

The control mode of the cooling fans 31 may be returned to independent control mode from coordinated control mode when the duty ratio of a control group adjacent to a control group being subject to coordinated control becomes less than 100% (the first threshold). Alternatively, the control group being subject to coordinated control may be returned to independent control mode when the duty ratio of a control group adjacent to the control group being subject to coordinated control becomes equal to or less than a second threshold, which is less than the first threshold.

Next, in group control according to embodiment 2, a processing flow executed by the processor 511 related to the control unit 51 of the control device 50 will be described. FIGS. 24 and 25 are flowcharts depicting an example of processing performed by the processor 511 of the control device 50. Processes depicted in FIGS. 24 and 25 are achieved by causing the processor 511 to execute, for example, a control program read from the auxiliary storage device 513 to the main storage device 512. This control program is repeatedly executed by the processor 511 at predetermined intervals while the control device 50 operates.

The processing in steps S101 to S104 of this flowchart is similar to that in steps S101 to S104 of the flowchart in FIG. 20, so detailed description is omitted. In step S101, the processor 511 reads the adjacent group set numbers corresponding to the control groups from the group information table TB. Upon completion of the processing in step S104, the processor 511 of the control unit 51 proceeds to step S201.

In step S201, the processor 511 decides whether there is a control group for which the duty ratio Dpwm has been determined to be equal to or more than the first threshold in step S103. Here, the processor 511 decides whether there is a control group for which the duty ratio Dpwm has been determined to be equal to 100%. In this step, if there is no control group for which the duty ratio Dpwm has been determined to be equal to 100%, the processor 511 proceeds to step S105. Otherwise, the processor 511 proceeds to step S202. The processing in steps S105 and S106 is similar to that in steps S105 and S106 of the flowchart depicted in FIG. 20, so detailed description is omitted.

In step S202, the processor 511 identifies the adjacency control group adjacent to the control group (referred to below as the assist target group) for which the duty ratio Dpwm has been decided to be 100% based on adjacent group set number information. Then, in step S203, the processor 511 switches the control mode of the adjacency control group identified in step S202 from independent control mode to coordinated control mode. Specifically, the processor 511 transmits the PWM signal that increases the number of revolutions (duty ratio) of the cooling fans 31 belonging to the adjacency control group adjacent to the assist target group by 5%. This increases number of revolutions of the cooling fan 31 belonging to the adjacency control group adjacent to the assist target group. As a result, the cooling of the electronic apparatus 2, which is the cooling target of the assist target group, is performed more efficiently. The processor 511 measures the time elapsed from the transmission of the PWM signal in step S203.

In step S204, the processor 511 calculates the group typical temperature Tgr of the assist target group when a predetermined time (for example, a few minutes) elapses after transmitting the PWM signal. Then, the processor 511 calculates the duty ratio Dpwm corresponding to the group typical temperature Tgr for the cooling fans 31 belonging to an assist control target group.

Next, in step S205, the processor 511 decides whether the duty ratio Dpwm of the assist target group calculated in step S204 is 100%. If the duty ratio Dpwm of the assist target group is decided to be 100%, the processor 511 proceeds to step S206. In contrast, if the duty ratio Dpwm of the assist target group is decided to be less than 100%, the processor 511 proceeds to step S207.

In step S206, the processor 511 transmits a PWM signal that increases, by further 5%, the duty ratio (the number of revolutions) of the cooling fans 31 belonging to the adjacency control group adjacent to the assist target group. Upon completion of the processing in step S206, the processor 511 returns to step S205. In step S207, the processor 511 decides whether the duty ratio Dpwm of the assist target group calculated in step S204 is equal to or less than the second threshold. The second threshold is set to a value less than the first threshold. Although the second threshold is set to 95% in embodiment 2, the second threshold may be changed. If the duty ratio Dpwm of the assist target group calculated in step S204 is decided to be equal to or less than 95% (the second threshold), the processor 511 proceeds to step S208. In contrast, if the duty ratio Dpwm of the assist target group calculated in step S204 is decided to be more than 95% (the second threshold), the processor 511 returns to step S205. The processing in step S205 is as described above.

In step S208, the processor 511 changes the control mode of the adjacency control group adjacent to the assist target group from coordinated control mode to independent control mode. As a result, the number of revolutions of the cooling fans 31 belonging to the adjacency control group that assisted the assist target group in coordinated control in accordance with the group typical temperature Tgr is controlled independently of the assist target group. Upon completion of the processing in step S208, the processor 511 proceeds to step S105. The processing in step S105 and subsequent steps is as described above.

As described above, since the electronic apparatus 2 is cooled while the control mode that controls the number of revolutions of the cooling fans 31 belonging to each control group is switched between independent control mode and coordinated control mode, the electronic apparatus 2 may be cooled more efficiently. Even if the cooling capability of a particular control group is reduced due to a failure of the cooling fan 31 or the like, the control group whose cooling capacity has been reduced may be assisted by adjacency control groups, thereby preferably suppressing the poor cooling of the electronic apparatus.

Computer-Readable Recording Media

A computer or another machine or device (referred to below as a computer or the like) may record a program that causes the computer or the like to achieve any of the above functions in recording media that is readable by the computer or the like. Then, the computer or the like reads the program from the recording media and executes it to provide the function.

The recording medium that is readable by the computer or the like is recording medium that stores information such as data or a program electrically, magnetically, optically, mechanically, or chemically so that the computer or the like is able to read it. Such recording media that are detachable from the computer or the like include a flexible disc, optical magnetic disc, CD-ROM, CD-R/W, DVD, Blu-ray disc, DAT, 8-mm tape, and a memory card such as a flash memory, for example. Media fixed to the computer or the like include a hard disk drive, read-only memory (ROM), and so on.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling apparatus that cools an electronic apparatus, the cooling apparatus comprising:
    cooling fans arranged in a plurality of groups to cool the electronic apparatus; and
    a control unit that controls a rotation speed of each of the plurality of groups of the cooling fans, the rotation speed of each group depending on a group temperature that corresponds to each group, the group temperature being calculated based on selecting a maximum temperature of the cooling fans of a group of the plurality of groups, and subtracting from the maximum temperature a temperature of ambient air adjacent to the electronic apparatus.

2. The cooling apparatus according to claim 1, wherein the control unit performs coordinated control in which the rotation speed of the cooling fans belonging to one group is controlled depending on a group temperature corresponding to the one group and a rotation speed of cooling fans belonging to another group.

3. The cooling apparatus according to claim 2, wherein the other group is adjacent to the one group.

4. The cooling apparatus according to claim 2, wherein the control unit controls the rotation speed of the cooling fans belonging to the one group using the coordinated control if the one group is adjacent to the other group and the rotation speed of the cooling fans belonging to the other group is equal to or more than a first threshold.

5. The cooling apparatus according to claim 1, wherein, if the group temperature is equal to or less than a predetermined reference temperature, the control unit stops rotation of cooling fans belonging to the group corresponding to the group temperature.

6. The cooling apparatus according to claim 1, wherein
    the electronic apparatus is accommodated in a cabinet; and
    the cooling fans are attached to the cabinet.

7. The cooling apparatus according to claim 1, wherein a temperature sensor is provided for each of the cooling fans and the group temperature is set based on a maximum temperature of temperatures obtained from temperature sensors provided for cooling fans belonging to one group.

8. A cooling method for cooling an electronic apparatus using a cooling apparatus, via cooling fans that are grouped into a plurality of groups, the cooling method comprising:
    obtaining representative group temperatures that correspond to each group, the representative group temperatures being calculated based on selecting a maximum temperature of the cooling fans of a group of the plurality of groups, and subtracting from the maximum temperature a temperature of ambient air adjacent to the electronic apparatus; and
    controlling a rotation speed of the cooling fans for each group depending on the representative group temperatures using a computer of the cooling apparatus.

9. The cooling apparatus according to claim 6, wherein a plurality of holding units that detachably hold the cooling fans are disposed on one surface of the cabinet.

10. The cooling method according to claim 8, wherein
    the electronic apparatus is accommodated in a cabinet; and
    the cooling fans are attached to the cabinet.

\* \* \* \* \*